(12) United States Patent
Burkhard et al.

(10) Patent No.: US 10,643,875 B2
(45) Date of Patent: May 5, 2020

(54) SYSTEM AND METHOD FOR SIMULTANEOUSLY FILLING CONTAINERS WITH DIFFERENT FLUENT COMPOSITIONS

(71) Applicant: The Procter & Gamble Company, Cincinnati, OH (US)

(72) Inventors: Ryan Andrew Burkhard, West Chester, OH (US); Nathan E Moore, Montgomery, OH (US); Elizabeth Marie Fikes, Cincinnati, OH (US); Daniel Richard Royce, Blue Ash, OH (US)

(73) Assignee: The Procter & Gamble Company, Cincinnati, OH (US)

(*) Notice: Subject to any disclaimer, the term of this patent is extended or adjusted under 35 U.S.C. 154(b) by 0 days.

(21) Appl. No.: 15/698,674

(22) Filed: Sep. 8, 2017

(65) Prior Publication Data
US 2018/0076069 A1  Mar. 15, 2018

Related U.S. Application Data

(60) Provisional application No. 62/385,299, filed on Sep. 9, 2016.

(51) Int. Cl.
*H01L 21/67* (2006.01)
*B29C 49/42* (2006.01)
(Continued)

(52) U.S. Cl.
CPC .... *H01L 21/67276* (2013.01); *B29C 49/4205* (2013.01); *B65B 59/00* (2013.01);
(Continued)

(58) Field of Classification Search
CPC ........... H01L 21/67276; B29C 49/4205; B67C 7/002; B67C 7/0006; B67C 3/24;
(Continued)

(56) References Cited

U.S. PATENT DOCUMENTS 3,403,634 A   10/1968   Crowder
3,601,246 A    8/1971   Dubois
(Continued)

FOREIGN PATENT DOCUMENTS

CN   201080430 U   7/2008
DE    19546870 A1   6/1996
(Continued)

OTHER PUBLICATIONS

Website, SIEMENS, Overview, "What makes mass production so flexible that it can meet individual demands?" http://www.siemens.com/ingenuity-for-life/en/optima/.
(Continued)

*Primary Examiner* — Timothy P. Kelly
(74) *Attorney, Agent, or Firm* — Andres E. Velarde; Jeffrey V. Bamber

(57) ABSTRACT

A system and method for simultaneously filling containers with different fluent products are disclosed. The system includes a plurality of vehicles that are independently routable along a track system to deliver containers to at least one unit operation station for dispensing fluent materials into the containers. The containers receive one or more fluent materials that differ from another in ingredients and/or weight percentage of at least one ingredient.

16 Claims, 13 Drawing Sheets

(51) Int. Cl.
  *B67C 3/24* (2006.01)
  *B65B 65/00* (2006.01)
  *B67B 1/00* (2006.01)
  *B67C 7/00* (2006.01)
  *B67B 3/00* (2006.01)
  *B65B 59/00* (2006.01)
  *B65G 54/02* (2006.01)
  *B67C 3/02* (2006.01)
  *G05B 19/418* (2006.01)

(52) U.S. Cl.
  CPC .......... *B65B 65/003* (2013.01); *B65B 65/006* (2013.01); *B65G 54/02* (2013.01); *B67B 1/00* (2013.01); *B67B 3/00* (2013.01); *B67C 3/02* (2013.01); *B67C 3/24* (2013.01); *B67C 7/002* (2013.01); *B67C 7/004* (2013.01); *B67C 7/0006* (2013.01); *G05B 19/41815* (2013.01); *B65B 2210/02* (2013.01); *B65B 2210/04* (2013.01); *B65G 2201/0261* (2013.01); *G05B 2219/32391* (2013.01); *G05B 2219/40554* (2013.01)

(58) Field of Classification Search
  CPC .......... B67C 7/004; B67C 3/02; B65B 65/006; B65B 65/003; B65B 59/00; B65B 54/02; B65B 2210/02; B65B 2201/0261; B65B 2210/04; G05B 19/41815; G05B 2219/40554; G05B 2219/32391
  See application file for complete search history.

(56) References Cited

U.S. PATENT DOCUMENTS

| | | |
|---|---|---|
| 3,687,082 A | 8/1972 | Burke, Jr. |
| 3,796,163 A | 3/1974 | Meyer et al. |
| 3,878,821 A | 4/1975 | White |
| 4,511,025 A | 4/1985 | Nakayama |
| 4,805,761 A | 2/1989 | Totsch |
| 4,841,869 A | 6/1989 | Takeuchi |
| 5,023,495 A | 6/1991 | Miyao |
| 5,208,762 A | 5/1993 | Charhut et al. |
| 5,233,534 A | 8/1993 | Osthus et al. |
| 5,237,510 A | 8/1993 | Kakizawa et al. |
| 5,251,741 A | 10/1993 | Morishita et al. |
| 5,555,504 A | 9/1996 | Lepper et al. |
| 5,607,045 A | 3/1997 | Hermann Kronseder |
| 5,713,180 A | 2/1998 | Lewis |
| 5,797,330 A | 8/1998 | Li |
| 5,803,797 A | 9/1998 | Piper |
| 5,869,139 A | 2/1999 | Biggs et al. |
| 6,011,508 A | 1/2000 | Perrault et al. |
| 6,101,952 A | 8/2000 | Thornton et al. |
| 6,104,966 A | 8/2000 | Haagensen |
| 6,191,507 B1 | 2/2001 | Peltier et al. |
| 6,240,335 B1 | 5/2001 | Wehrung et al. |
| 6,317,648 B1 | 11/2001 | Sleep et al. |
| 6,354,781 B1 | 3/2002 | Pan |
| 6,499,701 B1 | 12/2002 | Thornton et al. |
| 6,522,945 B2 | 2/2003 | Sleep et al. |
| 6,571,934 B1 | 6/2003 | Thompson et al. |
| 6,578,495 B1 | 6/2003 | Yitts et al. |
| 6,581,650 B2 | 6/2003 | Parks et al. |
| 6,591,756 B2 | 7/2003 | Mayer et al. |
| 6,625,517 B1 | 9/2003 | Bogdanov et al. |
| 6,781,524 B1 | 8/2004 | Clark et al. |
| 6,876,107 B2 | 4/2005 | Jacobs |
| 6,876,869 B1 | 4/2005 | Fujii |
| 6,917,136 B2 | 7/2005 | Thornton et al. |
| 6,983,701 B2 | 1/2006 | Thornton et al. |
| 7,011,728 B2 | 3/2006 | Dewig et al. |
| 7,103,450 B2 | 9/2006 | Kubiak et al. |
| 7,110,861 B2 | 9/2006 | Nelson et al. |
| 7,134,258 B2 | 11/2006 | Kalany et al. |
| 7,204,192 B2 | 4/2007 | Lamb et al. |
| 7,248,938 B2 | 7/2007 | Sclafani et al. |
| 7,264,426 B2 | 9/2007 | Buttrick, Jr. et al. |
| 7,430,838 B2 | 10/2008 | Mcerlean et al. |
| 7,448,327 B2 | 11/2008 | Thornton et al. |
| 7,456,593 B1 | 11/2008 | Floresta et al. |
| 7,458,454 B2 | 12/2008 | Mendenhall |
| 7,478,749 B2 | 1/2009 | Clothier et al. |
| 7,538,469 B2 | 5/2009 | Thornton et al. |
| 7,555,875 B2 | 7/2009 | Kim |
| 7,654,203 B2 | 2/2010 | Roop et al. |
| 7,668,618 B2 | 2/2010 | Mcerlean et al. |
| 7,761,180 B2 | 7/2010 | Scalfani et al. |
| 7,885,821 B2 | 2/2011 | Tait |
| 7,912,574 B2 | 3/2011 | Wurman et al. |
| 7,926,644 B2 | 4/2011 | Mendenhall |
| 7,954,712 B2 | 6/2011 | Babcock et al. |
| 7,988,398 B2 | 8/2011 | Hofmeister |
| RE42,937 E | 11/2011 | Lasher et al. |
| 8,074,578 B2 | 12/2011 | Thornton |
| 8,087,579 B2 | 1/2012 | Leu et al. |
| 8,096,409 B2 | 1/2012 | Wipf et al. |
| 8,109,066 B2 | 2/2012 | Leu et al. |
| 8,204,621 B2 | 6/2012 | Imai et al. |
| 8,271,139 B2 | 9/2012 | Bellafiore et al. |
| 8,281,888 B2 | 10/2012 | Bergmann |
| 8,308,418 B2 | 11/2012 | Ma et al. |
| 8,336,700 B2 | 12/2012 | Warecki et al. |
| 8,453,821 B2 | 6/2013 | Hutter et al. |
| 8,474,603 B2 | 7/2013 | Warecki et al. |
| 8,483,869 B2 | 7/2013 | Wurman et al. |
| 8,511,555 B2 | 8/2013 | Babcock et al. |
| 8,591,779 B2 | 11/2013 | Senn et al. |
| 8,609,371 B2 | 12/2013 | Julien et al. |
| 8,616,134 B2 | 12/2013 | King et al. |
| 8,627,639 B2 | 1/2014 | Ali et al. |
| 8,684,652 B2 | 4/2014 | Byrne et al. |
| 8,738,804 B2 | 5/2014 | Childress et al. |
| 8,763,792 B2 | 7/2014 | Iwasaki et al. |
| 8,776,985 B2 | 7/2014 | Huettner et al. |
| 8,805,574 B2 | 8/2014 | Stevens et al. |
| 8,807,330 B2 | 8/2014 | Kraus |
| 8,813,951 B2 | 8/2014 | Forsthoevel et al. |
| 8,863,669 B2 | 10/2014 | Young et al. |
| 8,875,865 B2 | 11/2014 | Terzini |
| 8,966,864 B2 | 3/2015 | Rabec |
| 8,967,051 B2 | 3/2015 | King et al. |
| 8,972,037 B2 | 3/2015 | Scalfani et al. |
| 9,032,880 B2 | 5/2015 | King et al. |
| 9,045,183 B2 | 6/2015 | Laurence et al. |
| 9,045,291 B2 | 6/2015 | Konrad et al. |
| 9,046,890 B2 | 6/2015 | Krause et al. |
| 9,122,566 B2 | 9/2015 | Bastian, II et al. |
| 9,132,873 B1 | 9/2015 | Laurence et al. |
| 9,139,377 B2 | 9/2015 | Assante et al. |
| 9,150,366 B2 | 10/2015 | Rudick et al. |
| 9,187,268 B2 | 11/2015 | Denninger et al. |
| 9,193,108 B2 | 11/2015 | Seger et al. |
| 9,204,920 B2 | 12/2015 | McPherson et al. |
| 9,221,482 B2 | 12/2015 | Gatterbauer et al. |
| 9,233,800 B2 | 1/2016 | Senn et al. |
| 9,239,335 B2 | 1/2016 | Heise et al. |
| 9,260,741 B2 | 2/2016 | Williams, Jr. |
| 9,272,847 B2 | 3/2016 | Varhaniovsky |
| 9,274,529 B2 | 3/2016 | Ben-Shachar et al. |
| 9,283,709 B2 | 3/2016 | Lindner et al. |
| 9,292,018 B2 | 3/2016 | Hanaka et al. |
| 9,315,334 B2 | 4/2016 | Mellars et al. |
| 9,316,659 B2 | 4/2016 | Dumitrescu |
| 9,327,855 B2 | 5/2016 | Hurni et al. |
| 9,346,371 B2 | 5/2016 | King et al. |
| 9,382,109 B2 | 7/2016 | Johansen et al. |
| 9,415,441 B2 | 8/2016 | Heinecke et al. |
| 9,457,856 B2 | 10/2016 | Yao et al. |
| 9,459,273 B2 | 10/2016 | Eberhardt et al. |
| 9,469,309 B2 | 10/2016 | Yagci et al. |
| 9,470,702 B2 | 10/2016 | Pollack et al. |
| 9,494,609 B2 | 11/2016 | Gelbman et al. |
| 9,511,947 B2 | 12/2016 | Pollack et al. |

(56) References Cited

U.S. PATENT DOCUMENTS

| | | |
|---|---|---|
| 9,611,107 B2 | 4/2017 | Wernersbach |
| 9,617,089 B2 | 4/2017 | Josefowitz et al. |
| 9,658,241 B2 | 5/2017 | Riether et al. |
| 9,664,703 B2 | 5/2017 | Heise et al. |
| 9,671,418 B2 | 6/2017 | Mellars |
| 9,676,560 B2 | 6/2017 | Senn et al. |
| 9,701,487 B2 | 7/2017 | Unterseher |
| 9,704,096 B2 | 7/2017 | Hudson et al. |
| 9,802,507 B2 | 10/2017 | Clark |
| 9,809,392 B2 | 11/2017 | Walter |
| 9,847,742 B2 | 12/2017 | Suzuki |
| 9,914,994 B2 | 3/2018 | Leahey |
| 10,158,304 B2 | 12/2018 | Suzuki |
| 10,167,143 B2 | 1/2019 | Senn |
| 2003/0176942 A1 | 9/2003 | Sleep et al. |
| 2004/0218521 A1 | 11/2004 | Bolinth et al. |
| 2005/0095087 A1 | 5/2005 | Sullivan et al. |
| 2007/0044676 A1 | 3/2007 | Clark et al. |
| 2007/0205220 A1 | 9/2007 | Rudick et al. |
| 2008/0128374 A1 | 6/2008 | Kyutoku |
| 2010/0140052 A1 | 6/2010 | Martini |
| 2011/0019877 A1 | 1/2011 | Kasemann et al. |
| 2011/0215109 A1 | 9/2011 | Bailey |
| 2011/0241845 A1 | 10/2011 | Sullivan et al. |
| 2011/0282476 A1 | 11/2011 | Hegemier et al. |
| 2012/0295358 A1 | 11/2012 | Ariff et al. |
| 2013/0015610 A1 | 1/2013 | Seger et al. |
| 2013/0018850 A1 | 1/2013 | Houlihan et al. |
| 2013/0026005 A1 | 1/2013 | Senn |
| 2013/0084259 A1 | 4/2013 | Lee |
| 2013/0144430 A1 | 6/2013 | Tao et al. |
| 2013/0152516 A1 | 6/2013 | Sammons et al. |
| 2014/0157732 A1 | 6/2014 | Gasber |
| 2014/0170085 A1 | 6/2014 | Peters et al. |
| 2014/0202831 A1 | 7/2014 | Varhaniovsky |
| 2014/0230660 A1* | 8/2014 | He .................. A47J 27/14 99/325 |
| 2014/0316546 A1 | 10/2014 | Walsh et al. |
| 2015/0010437 A1 | 1/2015 | Mellars et al. |
| 2015/0066189 A1 | 3/2015 | Mulligan et al. |
| 2015/0079220 A1 | 3/2015 | Lindner et al. |
| 2015/0083018 A1 | 3/2015 | Clark et al. |
| 2015/0140668 A1 | 5/2015 | Mellars et al. |
| 2015/0158611 A1 | 6/2015 | Kalany et al. |
| 2015/0159585 A1 | 6/2015 | Kinney et al. |
| 2015/0175281 A1 | 6/2015 | Py |
| 2015/0246777 A1 | 9/2015 | Trebbi et al. |
| 2015/0273691 A1 | 10/2015 | Pollack |
| 2015/0276774 A1 | 10/2015 | Pollack |
| 2015/0301072 A1 | 10/2015 | Gelbman |
| 2015/0303841 A1 | 10/2015 | Suzuki et al. |
| 2015/0353219 A1 | 12/2015 | Kohl |
| 2015/0355207 A1 | 12/2015 | Pollack et al. |
| 2015/0355208 A1 | 12/2015 | German et al. |
| 2015/0355211 A1 | 12/2015 | Mellars |
| 2015/0369832 A1 | 12/2015 | Sacco |
| 2016/0007720 A1 | 1/2016 | Kemp et al. |
| 2016/0011224 A1 | 1/2016 | Pollack |
| 2016/0031154 A1 | 2/2016 | Haas et al. |
| 2016/0086118 A1 | 3/2016 | Reed |
| 2016/0114988 A1 | 4/2016 | Unterseher |
| 2016/0122063 A1 | 5/2016 | Garriga Jimenez et al. |
| 2016/0167899 A1 | 6/2016 | Prinz |
| 2016/0176559 A1 | 6/2016 | Aumann et al. |
| 2016/0176560 A1 | 6/2016 | Aumann et al. |
| 2016/0194158 A1 | 7/2016 | Senn |
| 2016/0207717 A1 | 7/2016 | Senn et al. |
| 2016/0214799 A1 | 7/2016 | Walter et al. |
| 2016/0325938 A1 | 11/2016 | King et al. |
| 2016/0334799 A1 | 11/2016 | D'Andrea et al. |
| 2016/0341751 A1 | 11/2016 | Huber et al. |
| 2016/0355350 A1 | 12/2016 | Yamamoto |
| 2016/0380562 A1 | 12/2016 | Weber et al. |
| 2017/0050332 A1 | 2/2017 | Bauer et al. |
| 2017/0168079 A1 | 6/2017 | Sinz |
| 2017/0184622 A1 | 6/2017 | Sinz et al. |
| 2017/0225590 A1 | 8/2017 | Duvel et al. |
| 2017/0225900 A1 | 8/2017 | Radak et al. |
| 2017/0225911 A1 | 8/2017 | Baechle et al. |
| 2018/0071923 A1 | 3/2018 | Lyman et al. |
| 2018/0072445 A1 | 3/2018 | Burkhard et al. |
| 2018/0072505 A1 | 3/2018 | Lyman et al. |
| 2018/0072551 A1 | 3/2018 | Burkhard et al. |
| 2018/0072552 A1 | 3/2018 | Orndorff et al. |
| 2018/0073912 A1 | 3/2018 | Lyman et al. |
| 2018/0074086 A1 | 3/2018 | Moore et al. |
| 2018/0074477 A1 | 3/2018 | Burkhard et al. |
| 2018/0074478 A1 | 3/2018 | Burkhard et al. |
| 2018/0075506 A1 | 3/2018 | Burkhard et al. |
| 2018/0076069 A1 | 3/2018 | Burkhard et al. |

FOREIGN PATENT DOCUMENTS

| | | |
|---|---|---|
| DE | 19505997 | 8/1996 |
| DE | 19859955 A1 | 7/2000 |
| EP | 0619267 A1 | 10/1994 |
| EP | 0820862 B1 | 4/2001 |
| EP | 1163156 B1 | 11/2003 |
| EP | 1123886 B1 | 8/2004 |
| EP | 1837419 A1 | 9/2007 |
| EP | 1645340 B1 | 10/2010 |
| EP | 2420450 A1 | 2/2012 |
| EP | 2070843 | 10/2012 |
| EP | 2746165 A1 | 6/2014 |
| EP | 2865602 A1 | 4/2015 |
| EP | 2915521 A1 | 9/2015 |
| EP | 2921433 B1 | 9/2016 |
| EP | 3002222 B1 | 4/2017 |
| EP | 3173887 A1 | 5/2017 |
| EP | 2973369 B1 | 11/2017 |
| JP | H0551087 | 3/1993 |
| JP | H10315960 A | 12/1998 |
| JP | 2000289834 A | 10/2000 |
| JP | 2010132405 A | 6/2010 |
| JP | 2014133609 A | 7/2014 |
| WO | WO 2004030975 | 4/2004 |
| WO | WO2010058382 A1 | 5/2010 |
| WO | WO2012145789 A1 | 11/2012 |
| WO | WO2012152556 A2 | 11/2012 |
| WO | WO2013098202 A1 | 7/2013 |
| WO | WO 2014047104 | 3/2014 |
| WO | WO 2015101862 | 7/2015 |
| WO | WO2015117722 A1 | 8/2015 |
| WO | WO 2015126839 | 8/2015 |
| WO | WO 2016011464 A2 | 1/2016 |
| WO | WO2016012157 A1 | 1/2016 |
| WO | WO2016146213 A1 | 9/2016 |
| WO | WO2017013095 A1 | 1/2017 |
| WO | WO2017089182 A1 | 6/2017 |
| WO | WO2017103827 A1 | 6/2017 |
| WO | WO2017108421 A1 | 6/2017 |
| WO | WO2017108423 A1 | 6/2017 |
| WO | WO2017149377 A1 | 9/2017 |

OTHER PUBLICATIONS

Website, SIEMENS, Overview, "Specialist for packaging technology" http://w3.siemens.com/mcms/mc-solutions/en/mechanical-engineering/packaging-machine/mcs/mcs-video/Pages/mcs-videos.aspx.

Website, SIEMENS, Thomas, "What makes mass production so flexible that it can meet individual demands?" Packaging Digest, Automation, Sep. 27, 2016, http://www.packagingdigest.com/automation/masspackaging-production-flexible-meets-individual-demands1609?cid=n1.x.pkg01.edt.aud.packdgst.20160928.

YouTube video, XTS and KUKA robot, EtherCAT demo at the ETG booth at SPS/ IPC/ Drive show 2013, Published on Nov. 29, 2013 https://www.youtube.com/watch?v=UTWCIo7UEMA.

YouTube video, Beckhoff XTS application example: Bottling plant, Published on Jan. 21, 2013 https://www.youtube.com/watch?v=_HiA111v3-U.

(56) References Cited

OTHER PUBLICATIONS

International Search Report and Written Opinion dated Dec. 19, 2017, 11 pgs, U.S. Appl. No. 15/698,669.
International Search Report and Written Opinion dated Dec. 21, 2017, 16 pgs, U.S. Appl. No. 15/698,700.
International Search Report and Written Opinion dated Feb. 26, 2018, 14 pgs, U.S. Appl. No. 15/698,677.
International Search Report and Written Opinion dated Feb. 9, 2018, 11 pgs, U.S. Appl. No. 15/698,676.
International Search Report and Written Opinion dated Jan. 25, 2018, 10 pgs, U.S. Appl. No. 15/698,681.
International Search Report and Written Opinion dated Nov. 29, 2017, 13 pgs, U.S. Appl. No. 15/698,671.
International Search Report and Written Opinion dated Nov. 30, 2017, U.S. Appl. No. 15/698,673, 12 pgs.
International Search Report and Written Opinion datedDec.4, 2017, 13 pgs, U.S. Appl. No. 15/698,674.
Brochure, MagneMotion, A Rockwell Automation Company, "Independent Cart Technology", 16 pgs., Nov. 2016.

* cited by examiner

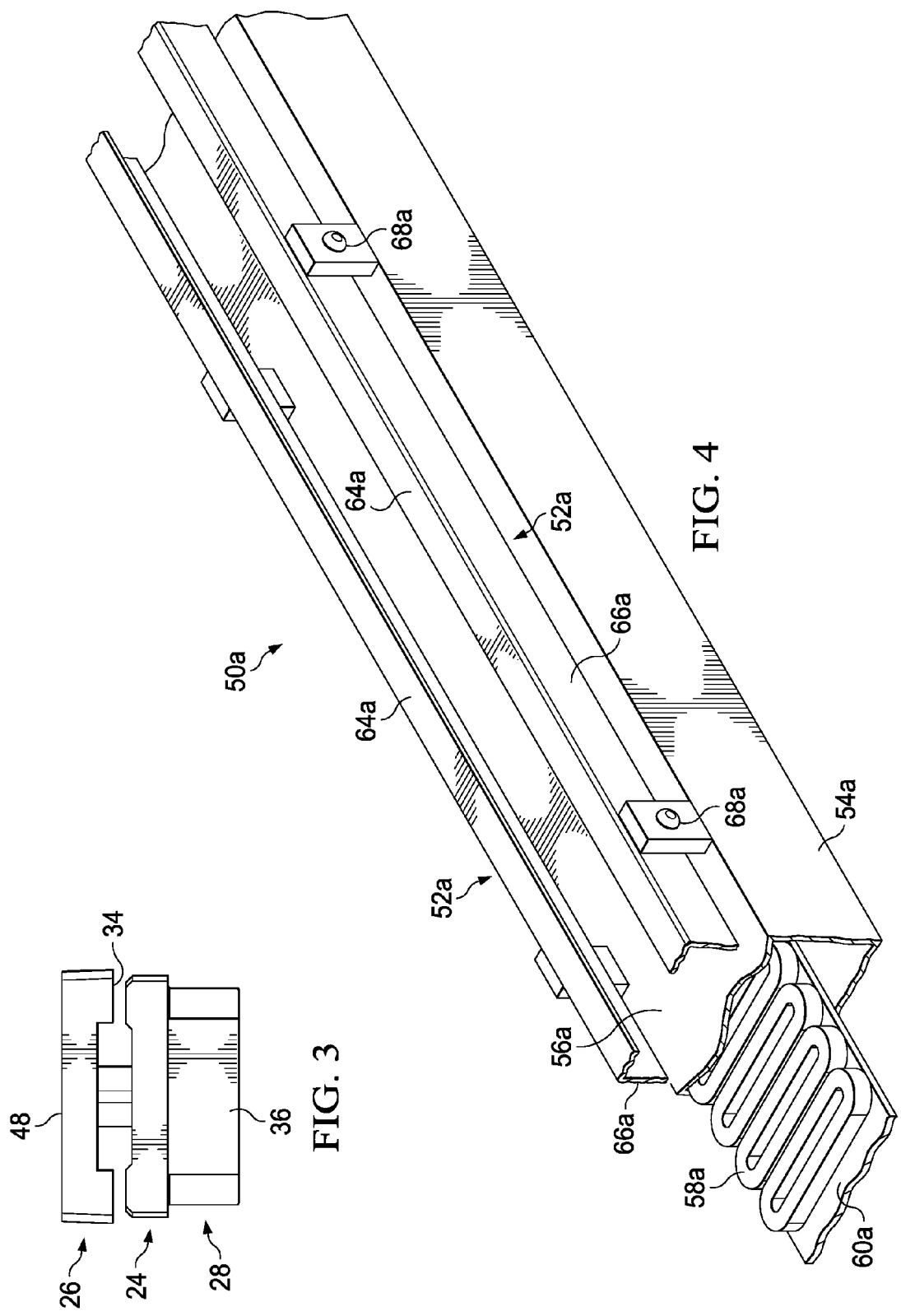

SYSTEM AND METHOD FOR SIMULTANEOUSLY FILLING CONTAINERS WITH DIFFERENT FLUENT COMPOSITIONS

TECHNICAL FIELD

The systems and methods described below generally relate to a track system and methods for transporting at least one container to one or more unit operation stations.

BACKGROUND

High speed container filling systems are well known and used in many different industries. In many of the systems, fluids are supplied to containers to be filled through a series of pumps, pressurized tanks and flow meters, fluid filling nozzles, and/or valves to help ensure the correct amount of fluid is dispensed into the containers. These high speed container systems are typically systems that are configured to only fill one type of container with one type of fluid. When a different container type and/or different fluid is desired from the system, the configuration of the system must be changed (e.g., different nozzles, different carrier systems, etc.) which can be time consuming, costly, and can result in increased downtimes. To provide consumers with a diverse product line, a manufacturer must employ many different high speed container systems which can be expensive and space intensive.

These high speed container filling systems are also typically incapable of providing different containers and arrangements of containers in a package without manual handling of the containers and/or packaging which can be time consuming, expensive, and frequently inaccurate.

Various patent publications disclose article handling systems (though not necessarily container filling systems). These include: U.S. Pat. No. 6,011,508, Perreault, et al.; U.S. Pat. No. 6,101,952, Thornton, et al.; U.S. Pat. No. 6,499,701, Cho; U.S. Pat. No. 6,578,495, Yitts, et al.; U.S. Pat. No. 6,781,524, Clark, et al.; U.S. Pat. No. 6,917,136, Thornton, et al.; U.S. Pat. No. 6,983,701, Thornton, et al.; U.S. Pat. Nos. 7,011,728 B2, 7,264,426 B2, Buttrick, Jr.; Dewig, et al.; U.S. Pat. No. 7,448,327, Thornton, et al.; U.S. Pat. No. 7,458,454, Mendenhall; U.S. Pat. No. 8,591,779 B2, Senn, et al.; U.S. Pat. Nos. 9,032,880; 9,233,800 B2, Senn, et al.; U.S. Patent Application Publications US 2015/0079220 A1 (now U.S. Pat. No. 9,283,709 B2, Lindner, et al.) and US 2016/114988 A1; and, EP Patent 1 645 340 B1. The search for improved high speed container filling systems has continued.

Thus, it would be advantageous to provide a filling system and methods of filling containers with an improved traffic control system. It would also be advantageous to provide a filling system and a method of filling containers that are versatile and can fill different containers with different fluids simultaneously. It would also be advantageous to provide a filling system and a method of filling containers that allows for on-demand fulfillment of orders without requiring manual packing.

SUMMARY

In accordance with one embodiment, a system is provided which comprises a plurality of containers for holding a fluent material, a plurality of vehicles for containers, and a track system comprising a track on which container-loaded vehicles are propellable. The track system comprises a primary transport portion that defines a primary path comprised of track that forms a closed loop that is configured to permit at least one container-loaded vehicle to travel in a holding pattern. The track system further comprises at least one secondary transport portion that extends from the primary transport portion and defines a secondary path that intersects the primary path at an ingress location and at an egress location. The system also comprises at least one unit operation station disposed along a secondary transport portion configured to perform a container treatment operation on at least one container or the contents thereof, of a container-loaded vehicle. The plurality of container-loaded vehicles are independently routable along the track system to deliver at least some of the containers to the at least one unit operation station for performing a container treatment operation at least some of the containers.

In accordance with another embodiment, a system is provided which comprises a plurality of first containers, a plurality of second containers, a track system, at least two unit operation stations disposed along the track system, and a plurality of vehicles propellable along the track system. Each of the plurality of first containers has a shape, and appearance, an opening, and a volume for holding a fluent material. Each of the plurality of second containers has a shape, an appearance, an opening, and a volume for holding a fluent material. One or more of the shape, appearance, and the volume of each of the second containers is different from one or more of the shape, appearance, and the volume, respectively, of each of the first containers. One or more of the first containers and one or more of the second containers are disposed on respective vehicles, and the one or more first containers and second containers are empty at the time they first become disposed on respective vehicles. The plurality of vehicles are routable along the track system to facilitate simultaneous delivery of the first containers and the second containers to different unit operation stations.

In accordance with yet another embodiment, a system is provided which comprises at least one container for holding a fluent material, a track system, a plurality of unit operation stations, and a plurality of vehicles propellable along the track system. The container has at least one opening and at least one closure is provided for selectively sealing the opening(s) of the container. One of the plurality of unit operation stations is disposed along the track system and configured to dispense fluent material into a container. Each container is disposed on a respective vehicle, and the plurality of vehicles are independently routable along the track system to deliver at least one container and at least one closure to at least one unit operation station for applying a closure onto a container.

In accordance with still yet another embodiment, a system is provided which comprises at least one first container and at least one second container for holding a fluent material, a track system, at least one unit operation station for dispensing fluent material disposed along the track system, and a plurality of vehicles propellable along the track system. A first container and a second container are disposed on the same or different vehicles. Each vehicle is independently routable along the track system to deliver the first and second containers to the at least one unit operation station. The first container and the second container receive one or more fluent materials dispensed by one or more filling unit operation stations for dispensing fluent material, wherein the filling unit operation stations are configured to dispense fluent material so that the first and second fluent compositions in the first and second containers differ from one another. The first and second fluent compositions may differ in one or more of the following ways. There is a difference in the presence or type of at least one ingredient in the fluent composition in the first container and that the fluent composition in the second container. In addition, or alternatively, the fluent compositions in the first and second containers have at least one common ingredient, and at least one of the following relationships is present: (a) the difference in weight percentage of the same ingredient in the two fluent compositions is greater than or equal to about 1.1 as determined by dividing the weight percent of the ingredient that is present in the greater amount in the two fluent compositions by the weight percent of the same ingredient that is present in the lesser amount in the two fluent compositions; and (b) when the weight percentage of at least one of the ingredients common to both the first and second containers is present in the two fluent composition in an amount of at least 2%, and the difference of the weight percent of the same ingredient in the two fluent compositions is greater than or equal to 2%.

In accordance with another embodiment, a system is provided which comprises a plurality of containers for holding a fluent material, a track system, a plurality of unit operation stations disposed along the track system, and a plurality of vehicles propellable along the track system. Each container is disposed on one of the vehicles, and each vehicle is independently routable along the track system to deliver the containers to at least one operation station. At least some of the vehicles have associated therewith a unique route along the track system assigned by a control system to facilitate simultaneous production of different finished products.

In accordance with yet another embodiment, a system is provided which comprises a plurality of containers for holding a fluent material, a plurality of vehicles for containers, a track system comprising a track on which container-loaded vehicles are propellable, a plurality of unit operation stations disposed along the track system and configured to cooperate to create at least one finished product. Each container is disposed on a vehicle, and the plurality of vehicles are independently routable along the track system to deliver at least some of the containers to at least one unit operation station. The system further comprises a control system comprising one or more controller units which: receives demand for finished products to be made; determines a route for a vehicle, where said route is determined based on a status of one or more unit operation stations; and causes a vehicle to be propelled to progress along said determined route so as to create one or more of said demanded finished products, and delivers one or more finished products to an unloading station.

In accordance with still yet another embodiment, a method of producing different fluent products on a single production line is provided. The method comprises the steps of: (a) providing a track system comprising a track on which container-loaded vehicles are propellable; (b) providing a plurality of empty containers comprising a first container and a second container; (c) providing a plurality of vehicles; (d) loading the first and second empty containers onto one or two vehicles; and (e) simultaneously sending one of the container-loaded vehicles to a filling unit operation station wherein a fluent product is dispensed into the first container and another one of the container-loaded vehicles to a filling unit operation station where a different fluent product is dispensed into the second container. Steps (a)-(c) may occur in any suitable order.

BRIEF DESCRIPTION OF THE DRAWINGS

It is believed that certain embodiments will be better understood from the following description taken in conjunction with the accompanying drawings in which:

FIG. 3 is a side view of the vehicle of FIG. 2.

FIG. 4 is an isometric view depicting a straight portion of the track of FIG. 1.

DETAILED DESCRIPTION

Definitions

Figure 1:
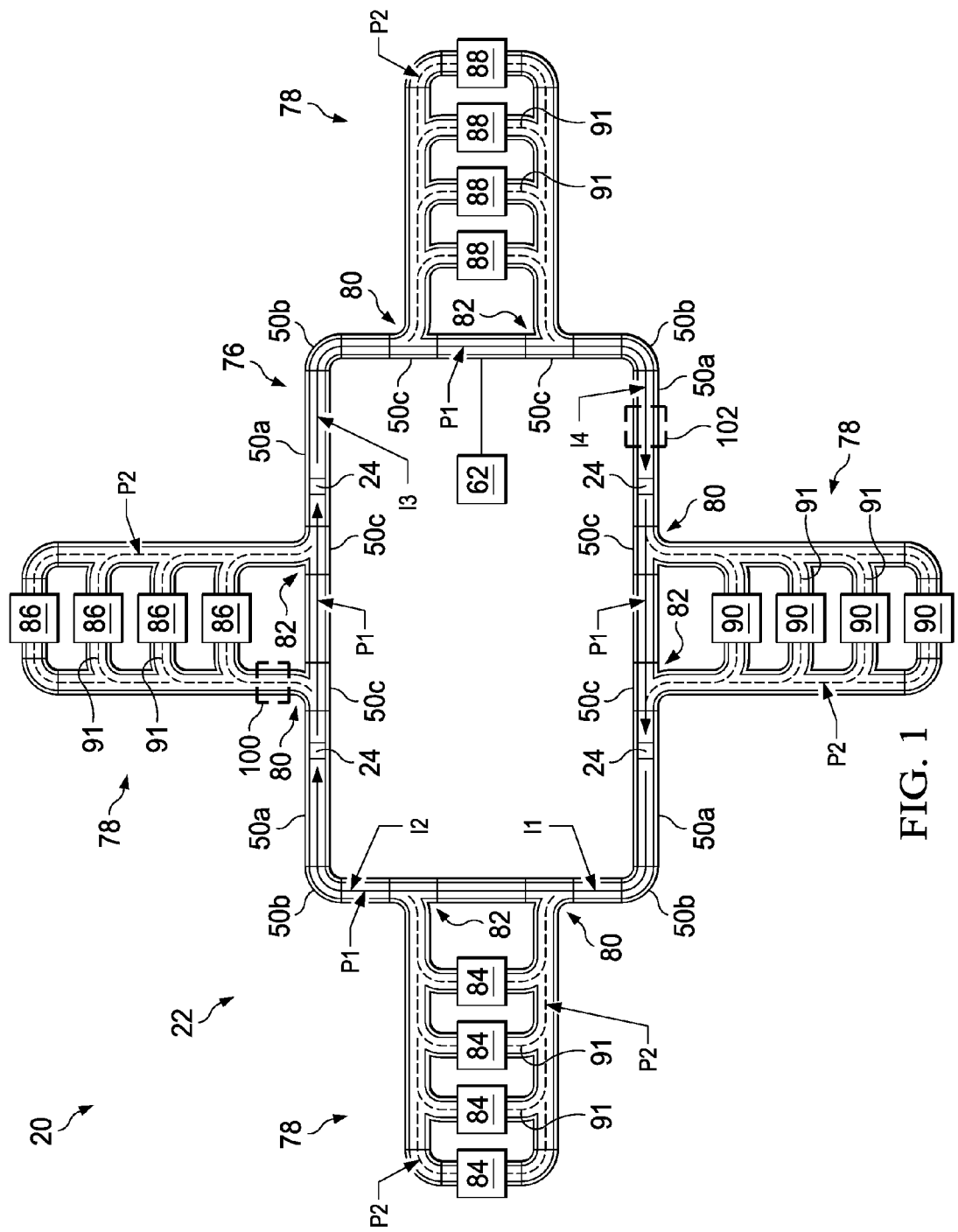
FIG. 1 is a schematic view depicting a track system having a track and a control system, in accordance with one embodiment.

The term "capping", as used herein, refers to applying any suitable type of closure to a container, and includes but is not limited to applying a cap to a container.

The term "constraints", as used herein as in "constraints on arriving at one or more unit operation stations", refers to limitations or restrictions on a vehicle arriving at one or more unit operation stations. Examples of constraints on arriving at one or more unit operation stations include: the infeed queue not being full; and requirements that one or more containers arrive before one or more other containers in order to form a specific package.

The term "container", as used herein, refers to an article that is capable of holding a material, such as a fluent material, and includes, but is not limited to bottles, unit dose pods, pouches, sachets, boxes, packages, cans, and cartons. The containers can have a rigid, flexi-resilient, or flexible structure in whole or in part.

The term "container-loaded", as used herein, means having one or more containers disposed thereon.

The term "container treatment operation", as used herein, refers to one or more of the following unit operations: (a) a filling operation station for dispensing fluent material into a container; (b) a decorating operation; and (c) a capping operation. The term "container treatment operation" does not include the operations of loading and/or unloading containers onto the vehicles. When the term "container treatment operation" is said to be performed on a container-loaded vehicle, it is understood that the operation can be performed on the container and/or its contents, as appropriate.

The term "decoration", as used herein, refers to a visual, tactile, or olfactory effect applied by means of material deposition that is applied directly, or transferred to an article or by transforming a property of an article, or combinations thereof. The article may include the container and/or the closure. Examples of a material deposition that is applied directly to an article include, but are not limited to applying a label to an article (labelling), and/or printing on an article. An example of transforming a property of an article without transferring a material to the surface of the article is imparting an image on the surface of an article by a laser. The term "decorating", as used herein, refers to the act of applying a decoration.

The term "different finished products", as used herein, means differing in container volume, container shape, container size, contained material volume or mass, contained ingredients, contained fluent product composition, container or closure appearance, closure type, container composition, closure composition, or other finished product attribute. The "appearance" of a container (and a closure) refers to its color, and any decoration thereon including any label or label contents thereon. When the finished products are described as differing from each other in one of more of the foregoing properties, it is meant to include those differences other than minor differences that are the result of variations within manufacturing tolerances.

The term "different fluent products", as used herein, means differing in at least one property such as: state (e.g., liquid, solid, or non-headspace gas), differing amounts of one or more states of matter in the fluent products, differences in ingredients, differing amounts of one or more ingredients in the fluent products, observable properties (as perceived or measured by an observer such as color, scent, viscosity), particle size of any solid particles, and other properties. When the fluent products are described as differing from each other in one of more of the foregoing properties, it is meant to include those differences other than minor differences that are the result of variations within manufacturing tolerances. With respect to differences between two different fluent products based on their respective ingredient(s), it means when one of the two fluent products comprises an ingredient that is absent from the other fluent product. With respect to differing amounts of at least one same ingredient in two different fluent products, it means when the two different fluent products each contain the at least one same ingredient with a minimum or greater difference based on weight, as determined by one or both of the following methods. Both methods rely on knowledge of the proportion of said same ingredient in each different formula as a weight percent of the total fluent product weight of the total amount fluent product(s) contained with each fluent product's respective container associated with their respective finished product. Method 1 determines that two fluent products are different if the ratio of the weight percent of the same ingredient in the two fluent products is greater than or equal to about 1.1 (and, thus, greater than or equal to about 1.25) as determined by dividing the weight percent that is the greater of the two fluent products by the weight percent that is the lesser of the two fluent products. Method 2 applies to when the weight percent of the same ingredients are each present in each of the fluent materials is minimally equal to or greater than 2% (as expressed as a weight percent) and the difference of the weight percent of the same ingredient in the two fluent products is about equal or greater than 2%, or any integer % value up to and including 99%, as determined by subtracting the weight percent that is the greater of the two fluent products by the weight percent that is the lesser of the two fluent products. Different fluent products refer to the entirety of the weight sum of fluent product(s) contained within a finished product wherein the fluent product(s) may be contained within one or multiple fluent product-containing chambers. Non-headspace gas refers to pressurized gas of which examples include: propellant gas such as for aerosol products and pressurized gas for a sealed chamber to provide structural support or shape definition to a container.

The terms "disposed on" or "disposed thereon", as used herein with reference to the containers on container-loaded vehicles, means any of the following: held by, affixed to, or otherwise coupled to in a removable manner. When the containers are described as being disposed on the vehicles, the container(s) can be in any suitable orientation with respect to the vehicles including, but not limited to: on top of the vehicles, underneath the vehicles, adjacent to one or more of the sides of the vehicles, or (if there are more than one container disposed on a vehicle) any combinations thereof.

The term "fast cycle", with respect to stations, refers to inspection stations, such as weighing stations, scanners (e.g., for scanning bar codes, QR codes, RFID codes, etc.), vision systems, metal detectors, and other types of stations in which the task performed at such stations are carried out in a minimal amount of time relative to at least some other unit operation stations.

The term "finished product", as used herein, comprises a container, the fluent material (or contents) therein, any decoration on the container, and the closure on the container.

The term "fluent product" (or "fluent material"), as used herein, refers to liquid products, gels, slurries, flowable pastes, pourable solid products (including, but not limited to granular materials, powders, beads, and pods), and/or gaseous products (including, but not limited to those used in aerosols).

The term "holding pattern", as used herein, means that at least one (empty) vehicle or container-loaded vehicle travels past at least one point on a closed loop (of a main closed loop or sub-loop) twice while traveling in the same direction without an intervening trip in the opposite direction past said point. In addition, the term "holding pattern" means that the container-loaded vehicle also does not unload a container in between passing through the point twice. Thus, a typical operation of recirculating a vehicle to make a second product after using the vehicle to make a first product would not be considered moving the vehicle in a holding pattern. When it is said that a container is "empty", the container will be considered to be empty even though it contains atmospheric air therein.

The term "infeed queue", as used herein, refers to an area where vehicles wait for a unit operation station to become ready to receive the vehicles. The infeed queue can be expressed in terms of a length of track or a number of vehicles that can be queued in this area. Different unit operation stations may either have the same or different infeed queue lengths. Therefore, the queue lengths of some unit operation stations may be shorter or longer than the queue lengths at other unit operation stations. The infeed queue can (if using the number of vehicles) range from 0 (if no vehicles are able to wait in front of a given vehicle), up to hundreds of vehicles. In some cases, the queue length may be between about 2-10 vehicles.

The term "inspection", as used herein, may include any of the following: scanning, weighing, detecting the presence or orientation of a container, or other types of inspection. Inspections may be performed by weighing stations, scanners (e.g., for scanning bar codes, QR codes, RFID codes, etc.), vision systems, metal detectors, and other types of stations.

The term "interface point", as used herein, refers to a specific location on a track. The interface point location is pre-selected, for the purpose of the product scheduling controller. Exactly one interface point can be defined along the track between adjacent unit operation station groups, such that it could be said that a unit operation station group has an upstream interface point located between the unit operation stations of the unit operation station group and the unit operation stations of an upstream unit operation station group, and that a unit operation station group has a downstream interface point located between the unit operation stations of the unit operation station group and the unit operation stations of a downstream unit operation station group. As an example, the unit operation stations 86 of FIG. 1 comprise a unit operation station group. This unit operation station group has an upstream interface point I2 (FIG. 1) and a downstream interface point I3 (FIG. 1). Elaborating on the same example, the unit operation stations 88 of FIG. 1 comprise a second unit operation station group. The second unit operation station group has an upstream interface point I3 (FIG. 1) and a downstream interface point I4 (FIG. 1). Thusly, an interface point may serve as both a downstream interface point for a first unit operation station group and an upstream interface point for a second unit operation station group. Interface points need not (and often do not) correspond to the location of ingress or egress switches. Interface points may be on either the primary transport path or the secondary transport path(s).

The term "joined to" as used throughout this disclosure, encompasses configurations in which an element is directly secured to another element by affixing the element directly to the other element; configurations in which the element is indirectly secured to the other element by affixing the element to intermediate member(s) which in turn are affixed to the other element; and configurations in which one element is integral with another element, i.e., one element is essentially part of the other element.

The term "operation", as used herein with respect to an activity that occurs at a unit operation station, includes transformations and inspections.

The term "packaging", as used herein, means a structure or material that is at least partially disposed on or about a consumer product. "Primary packaging" means the container in which the consumer product is in direct contact and includes its closure, pump, cap, or other peripheral items. "Secondary packaging" means any additional materials that are associated with the primary packaging, such as, for example, a container such as a box or polymeric sleeve that at least partially surrounds, contains, or contacts the primary packaging.

The term "plurality", as used herein, means more than one.

The term "propellable", as used herein, means able to be propelled in any manner. Vehicles can be propellable, for example, by gravity, or by a propulsive force which may be mechanical, electrical, magnetic, or other form of propulsion.

The term "route", as used herein, refers to an ordered list of unit operation stations for a container-loaded vehicle to visit and operations to be completed at such unit operation stations in order to create finished products.

The term "simultaneous", as used herein, not only means something that starts at the (exact) same time, but also something that may not start and/or end at the exact same time, but which takes place during the same time frame. One or more of the following may be specified to occur simultaneously in the systems and methods described herein: the routing of vehicles; the delivery of different vehicles to unit operation stations; the carrying out of operations at the same or different unit operation stations; and/or the process of (or any steps in the process of) creating a plurality of (the same or different) finished products in the same type of container or in different types of containers.

The term "system", as used herein with respect to the track, refers to a (single) network on which one or more container-loaded vehicles can be routed to one or more unit operations. The tracks and paths in a system will, therefore, typically be joined (at least indirectly) to each other. In contrast, separate unconnected processing lines in the same building or facility, or in a different building or facility, would not be considered to comprise a system. Thus, two unconnected filling lines in the same building that are being operated to fill containers with different fluids would not be considered to comprise a system.

The terms "transformation", as used herein, includes physical, chemical, and biological changes to a container and/or its contents. Examples of transformations include, but are not limited to: loading, dispensing, filling, mixing, capping, sealing, decorating, labelling, emptying, unloading, heating, cooling, pasteurizing, sterilizing, wrapping, rotating or inverting, printing, cutting, separating, pausing to allow mechanical settling or mechanical separation or chemical reaction, or etching. The term "transformation" does not include inspection of a container and/or its contents.

The term "unique", as used herein to modify the term "route", means the number, type, or sequence of unit operation stations or operations completed at the unit operation stations differs from that of another container-loaded vehicle.

The term "unit operation station", as used herein, means a location where the container or its contents undergoes an operation which may be a transformation or an inspection. The types of transformations defined above may each be carried out at separate unit operation stations; or one or more transformations and/or inspections may be described as one operation that is carried out at a single unit operation station. In one non-limiting example of the latter, the transformations of uncapping, filling, and capping could be carried out at a single filling/capping unit operation station.

All percentages and ratios are calculated by weight of the total composition, unless otherwise indicated.

In connection with the views and examples of FIGS. 1-9 (including FIGS. 1A to 1D), wherein like numbers indicate the same or corresponding elements throughout the views, a track system 20 is shown in FIG. 1 to include a track 22 and a plurality of vehicles 24 that are propellable along the track 22. The track system 20 can comprise any suitable type of system. In some embodiments, the track system 20 can be a linear synchronous motor (LSM) based system that facilitates propulsion of the vehicles 24 along the track 22 using electromagnetic force (EMF). In other embodiments, the track system can be a system in which the vehicles are propelled in some other manner, such as by individual servo motors. In the embodiment shown, however the vehicles are propelled by a linear synchronous motor (LSM) based system.

Figure 2:
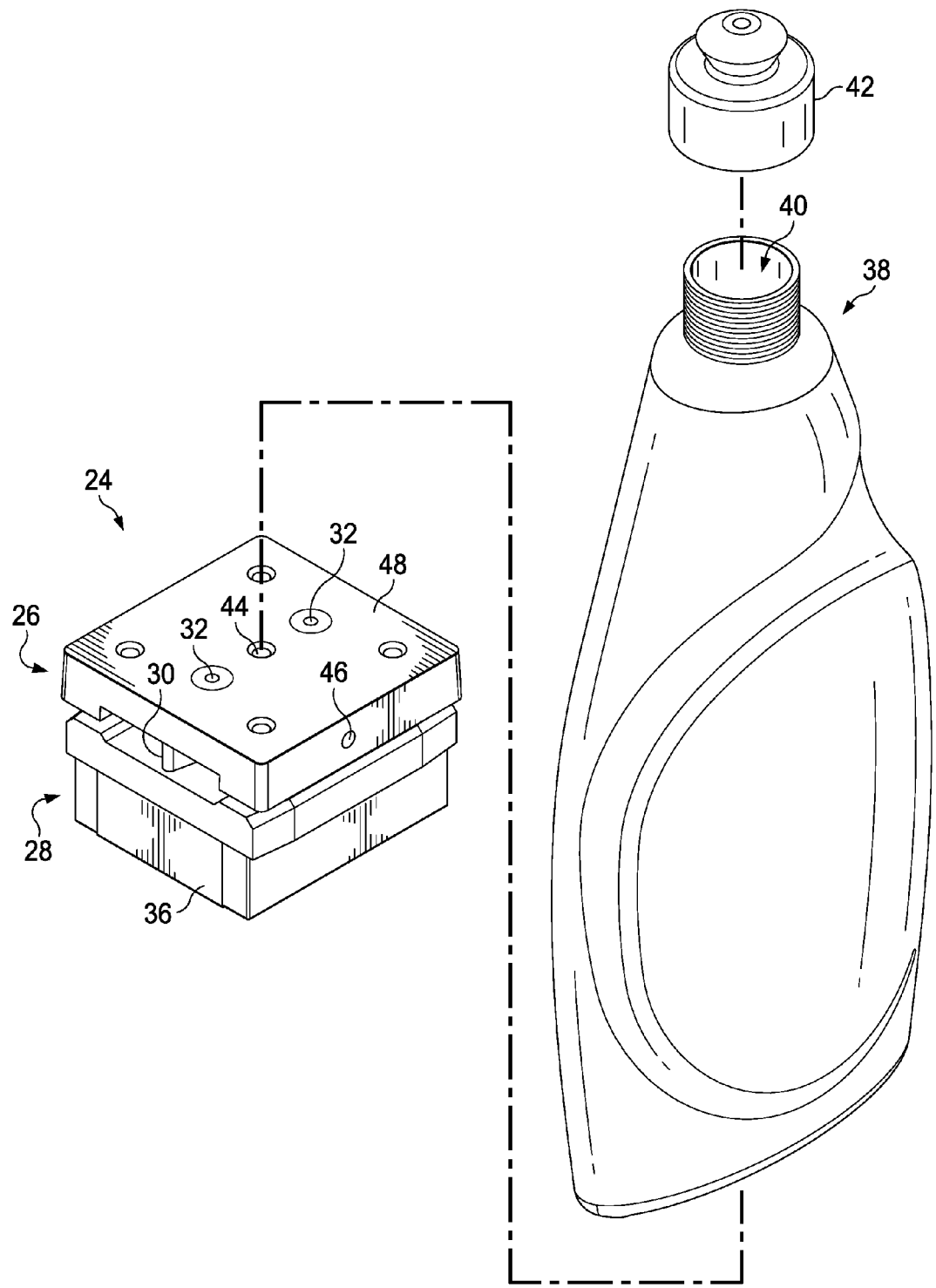
FIG. 2 is an exploded isometric view depicting a vehicle for the track system of FIG. 1 associated with a container.

One of the vehicles 24 is illustrated in FIG. 2 and is shown to include an upper portion 26 and a lower portion 28 that are coupled together by a central rib 30. In one embodiment, the upper and lower portions 26, 28 can be releasably coupled together with fasteners 32. The upper and lower portions 26, 28 can be spaced from each other by the central rib 30. As illustrated in FIG. 3, the upper portion 26 can include a wear surface or running surface 34 that is adjacent to the central rib 30 and faces the lower portion 28. The lower portion 28 can include a magnet 36 that facilitates LSM propulsion of the vehicle 24 along the track 22. In one embodiment, the magnet 36 can be a magnet array having a central magnet that is formed of a south pole and sandwiched between two ends that are each formed as a north pole. It is to be appreciated that the vehicles 24 can be any of a variety of suitable alternative arrangements for facilitating LSM propulsion along a track system. Some examples of these alternative arrangements are described in U.S. Pat. Nos. 6,011,508; 6,101,952; 6,499,701; 6,578,495; 6,781,524; 6,917,136; 6,983,701; 7,448,327; 7,458,454; and 9,032,880.

A container 38 can be provided on the vehicle 24 for routing of the container 38 around the track 22 to facilitate filling of the container 38 with fluent material and/or performing other operations on the container and/or its contents. The container 38 can define at least one opening 40 for receiving and dispensing fluent material. When it is said that the container has an opening 40, embodiments with multiple openings (such as multi-compartment containers with separate closures or a single closure, press-tab vent and dispenser containers, and the like) are also included. There can be multiple containers on a single vehicle, or on different vehicles.

When there is more than one container on the track system 22, the containers 24 may be all of the same type or geometric form (that is, the containers are of the same size, shape, appearance, and have the same volume), or any of the containers may differ from the other in one or more of size, shape, appearance, or volume. When reference is made to the "shape" of a container, it is understood that this means the exterior shape of the container. When reference is made to the "volume" of a container, it is understood that this means the interior volume of the container. The multiple containers can be identified as first, second, third, etc. containers. On the track system at any given time, more than two containers may differ and/or hold fluent materials that differ from other containers. In some embodiments, there may be 3, 4, 5, 6, 7, 8, 9, 10, or more, different types of containers, or groups of different types of containers (that may differ from each other in container type and/or in the fluent materials contained therein) that are disposed along the track system at any given time.

A closure 42 can be joined to the container to close the opening 40 until it is desired to dispense the product from the container (that is, the closure "selectively seals" the opening). Closures include, but are not limited to: caps, such as snap caps, threaded-screw caps, caps comprising multiple parts like a hinge and top or a transition spout, glued-on caps (such as those used on some laundry detergent containers with spouts), caps that serve metering functions like oral rinse caps, pumps or triggers, and aerosol nozzles. The closures have a shape, a size, and appearance. Similarly to the containers, the closures may all be of the same type, or any of the closures may differ from others in one or more of shape, size, or appearance. The multiple closures can be identified as first, second, third, etc. closures.

In one embodiment, as shown in FIG. 2, the container 38 can be releasably secured to the vehicle 24 via a vacuum port 44 defined by the upper portion 26 of the vehicle 24. In such an embodiment, when the container 38 is placed upon the upper portion 26 of the vehicle 24, a vacuum can be drawn on the vacuum port 44 by drawing a vacuum on a primary port 46. When the container 38 is provided over the vacuum port 44 and a vacuum is drawn on the vacuum port 46, the vacuum can secure the container 38 to the vehicle 24. The primary port 46 can include a valve, such as a Schrader valve (not shown) that selectively fluidically isolates the primary port 46 from the vacuum port 44 such that once a vacuum is drawn on the container 38, the valve prevents the vacuum from releasing until the valve is subsequently actuated. In one embodiment, an upper surface 48 of the upper portion 26 can be formed of an elastomeric or other similar material that encourages an effective seal between the container 38 and the upper surface 48. It should be understood that although part of the vehicle 24 is described herein as the upper portion 26, this portion this portion of the vehicle comprises a retaining surface for the container, and need not always be oriented upward. The retaining surface can be oriented in any suitable direction, including downward (upside down) or sideways at any suitable stage of the processes described herein. (Of course, a container with fluent material therein and its opening unsealed, will typically not be conveyed in an upside down condition, but an empty container or a closed container could be conveyed upside down or sideways.)

It is to be appreciated that containers, as described herein, can be any of a variety of configurations and can be used across a variety of industries to hold a variety of products. For example, any embodiment of containers, as described herein, may be used across the consumer products industry and the industrial products industry, wherein said containers contain a fluent product. The containers may be filled in one or multiple filling operations to contain, after partial or complete intended filling, a portion, or multiple ingredients of, or all ingredients of, a finished product. Finished products may in part or whole be flowable or fluent.

Examples of finished products include any of the following products, in whole or part, any of which can take any workable fluent product form described herein or known in the art: baby care products (e.g. soaps, shampoos, and lotions); beauty care products for cleaning, treating, beautifying, and/or decorating human or animal hair (e.g. hair shampoos, hair conditioners, hair dyes, hair colorants, hair repair products, hair growth products, hair removal products, hair minimization products, etc.); beauty care products for cleaning, treating, beautifying, and/or decorating human or animal skin (e.g. soaps, body washes, body scrubs, facial cleansers, astringents, sunscreens, sun block lotions, lip balms, cosmetics, skin conditioners, cold creams, skin moisturizers, antiperspirants, deodorants, etc.); beauty care products for cleaning, treating, beautifying, and/or decorating human or animal nails (e.g. nail polishes, nail polish removers, etc.); grooming products for cleaning, treating, beautifying, and/or decorating human facial hair (e.g. shaving products, pre-shaving products, after shaving products, etc.); health care products for cleaning, treating, beautifying, and/or decorating human or animal oral cavities (e.g. tooth-paste, mouthwash, breath freshening products, anti-plaque products, tooth whitening products, etc.); health care products for treating human and/or animal health conditions (e.g. medicines, medicaments, pharmaceuticals, vitamins, nutraceuticals, nutrient supplements (for calcium, fiber, etc.), cough treatment products, cold remedies, lozenges, treatments for respiratory and/or allergy conditions, pain relievers, sleep aids, gastrointestinal treatment products (for heartburn, upset stomach, diarrhea, irritable bowel syndrome, etc.), purified water, treated water, etc.; pet care products for feeding and/or caring for animals (e.g. pet food, pet vitamins, pet medicines, pet chews, pet treats, etc.); fabric care products for cleaning, conditioning, refreshing and/or treating fabrics, clothes and/or laundry (e.g. laundry detergents, fabric conditioners, fabric dyes, fabric bleaches, etc.); dish care products for home, commercial, and/or industrial use (e.g. dish soaps and rinse aids for hand-washing and/or machine washing); cleaning and/or deodorizing products for home, commercial, and/or industrial use (e.g. soft surface cleaners, hard surface cleaners, glass cleaners, ceramic tile cleaners, carpet cleaner, wood cleaners, multi-surface cleaners, surface disinfectants, kitchen cleaners, bath cleaners (e.g. sink, toilet, tub, and/or shower cleaners), appliance cleaning products, appliance treatment products, car cleaning products, car deodorizing products, air cleaners, air deodorizers, air disinfectants, etc.), and the like. Personal care products include cosmetics, hair care, skin care, and oral care products, i.e., shampoo, soap, tooth paste for human use.

As further examples, any embodiment of containers, as described herein, may contain products or product elements to be used across additional areas of home, commercial and/or industrial, building and/or grounds, construction and/or maintenance. As further examples, any embodiment of containers, as described herein, may contain products or product elements to be used across the food and beverage industry. As still further examples, any embodiment of containers, as described herein, may contain products or product elements to be used across the medical industry.

It is to be appreciated that the containers (e.g., 38) can be formed of any of a variety of suitable materials, such as, for example, a polymeric composition. The polymeric composition can be formed (e.g., molded into various articles such as containers, formed into one or more pieces of film that are joined together to form a container, or otherwise formed) into products and product packaging. In some cases (such as to form bottles), the composition may be extrusion blow molded or injection molded. Typically, high density polyethylene (HDPE) is extrusion blow molded and polyethylene terephthalate (PET) is injection stretch blow molded. A completely assembled container may comprise one or more elements which include, but are not limited to a container, a closure, a nozzle, and/or a handle.

The vehicles 24 can be configured to accommodate certain of the container types. As such, different vehicle types can be provided on the track 22 to allow for simultaneous routing of different container types along the track 22. The vehicles 24 are also not limited to conveying containers. In some cases, the vehicles 24 can be used for other purposes which may include, but are not limited to: delivering raw materials to a unit operation station; and delivering tools such as changeover tools and the like to various locations around the track system. For example, a vehicle may be used to carry a tool that removes labels from a decoration unit operation station.

Referring again to FIG. 1, the track 22 can be formed by a plurality of straight portions 50a, a plurality of curved portions 50b, and a plurality of transition portions 50c. One of the straight portions 50a is illustrated in FIG. 4 and is shown to include a pair of rails 52a that are coupled with a base 54a. The base 54a can include a running surface 56a and a plurality of conductive propulsion coils 58a disposed beneath the running surface 56a. The conductive propulsion coils facilitate routing of the vehicles along the track 22 in a direction of travel. Each conductive propulsion coil defines a common axis and comprises a conductor having one or more turns that are disposed about the common axis. The respective common axes of the plurality of conductive propulsion coils may be substantially parallel with one another and substantially orthogonal to the desired direction of travel. The plurality of coils 58a can be mounted on an underlying substrate 60a, which in some embodiments can be a printed circuit board (PCB). The plurality of coils 58a can be electrically coupled with a power source (not shown) that can facilitate energization of the power coils 58a to propel the vehicles 24 along the track 22. The propulsion coils 58a may be disposed on at least one of the opposing sides of the magnet of a vehicle to facilitate propulsion of the vehicle along the track system. A control system 62 (FIG. 1) can control the energization of the coils 58a to control the propulsion of the vehicles 24 along the track 22. In one embodiment, each coil 58a can be electrically coupled to a transistor (e.g., a MOSFET or IGBT) which is coupled with an output of an "H-bridge". The control system 62 can control the propulsion of each of the vehicles 24 along the track 22 through operation of the H-bridge which controls the amount and direction of current in each coil 58a. Hall effect sensors (not shown) can be distributed along the base 54a to facilitate detection of the magnetic field produced by the vehicles 24 on the track 22. The control system 62 can be in electrical communication with the Hall effect sensors to facilitate selective control of various propulsion characteristics of the vehicles 24 (e.g., speed, direction, position).

Each rail 52a can have an upper portion 64a and a side portion 66a that cooperate together to form an L-shape when viewed from the end. Each of the rails 52a are coupled at the side portions 66a to the base 54a with fasteners 68a. When each vehicle 24 is provided on the track 22, the upper portions 64a of each of the rails 52a can extend into the space between the upper and lower portions 26, 28 of the vehicle 24 such that the wear surface 34 of the upper portion 26 of the vehicle 24 can ride on the upper portion 64a of the rails 52a. In alternative embodiments, the wear surface can have wheels extending therefrom, and the wheels can travel over the upper portion 64a of the rails 52a. The side portions 66a of each of the rails 52a can extend along opposite sides of the lower portion 28 of the vehicle 24. During operation of the vehicles 24 along the track 22, the rails 52a can facilitate guidance of the vehicles 24 along the running surface 56a while suspending the vehicle 24 above the running surface 56a enough to allow the vehicles 24 to be magnetically propelled along the track 22.

Figure 5:
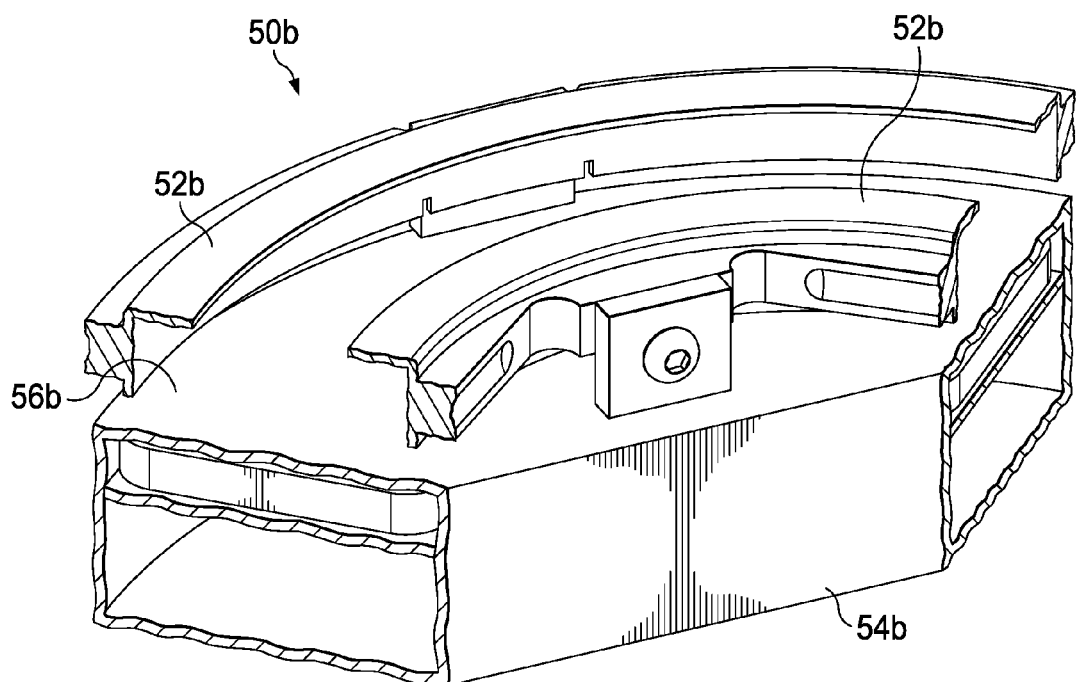
FIG. 5 is an isometric view depicting a curved portion of the track of FIG. 1.

Referring now to FIG. 5, one of the curved portions 50b is illustrated, which is similar to, or the same as in many respects as the straight portion 50a illustrated in FIG. 4. For example, the curved portion 50b can include a pair of rails 52b that are coupled with a base 54b. The base 54b can include a running surface 56b and a plurality of coils (not shown) that are disposed beneath the running surface 56b. However, the curved portion 50b can be angled by about 90 degrees to facilitate turning of the vehicles 24 along the track 22.

Figure 6:
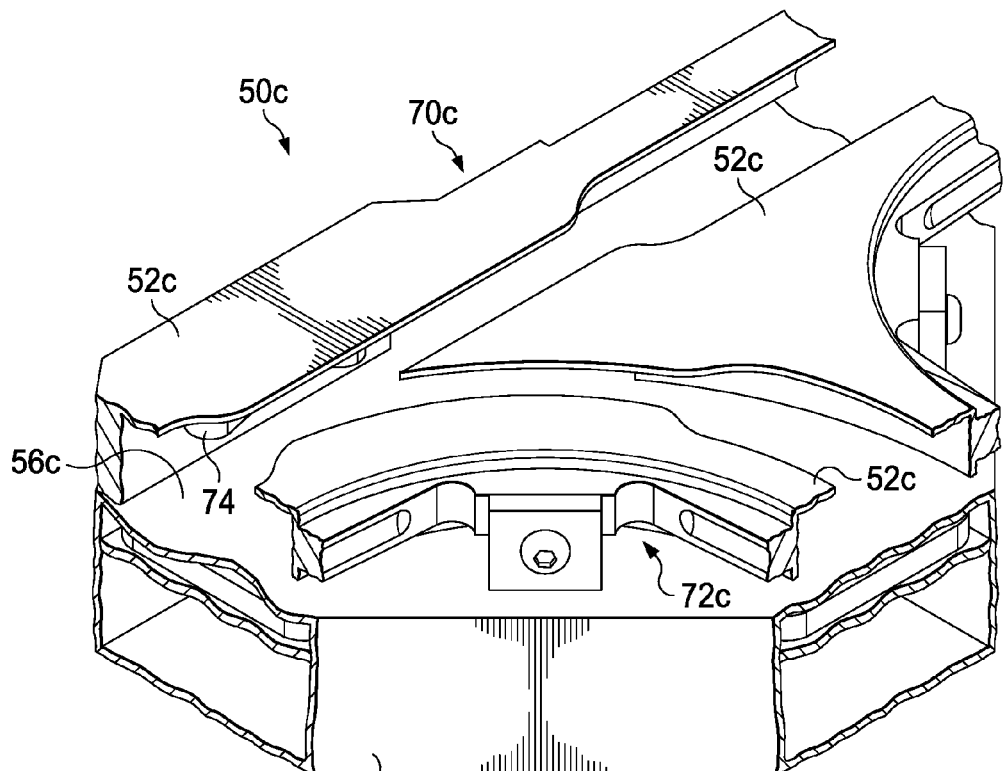
FIG. 6 is an isometric view depicting a transition portion of the track of FIG. 1.

Referring now to FIG. 6, one of the transition portions 50c is illustrated, which is similar to, or the same as in many respects as the straight portion 50a illustrated in FIG. 4. For example, the transition portion 50c can include a plurality of rails 52c that are coupled with a base 54c. The base 54c can include a running surface 56c and a plurality of coils (not shown) that are disposed beneath the running surface 56c. However, the transition portion 50c can have a straight portion 70c and an angled portion 72c that facilitate routing of the vehicles 24 in different directions. In one embodiment, the transition portion 50c can include a flipper member 74 that is pivotable between a retracted position (shown in FIG. 6) and an extended position (not shown). When the flipper member 74 is in the retracted position, a passing vehicle 24 will travel along the straight portion 70c of the transition portion 50c. When the flipper member 74 is in the extended position, a passing vehicle 24 will be routed from the straight portion 70c to the angled portion 72c. The control system 62 can be in electrical communication with the flipper member 74 to facilitate selective control of the routing of passing vehicles 24 to either the straight portion 70c or the angled portion 72c. It is to be appreciated that any of a variety of suitable alternative ingress switches and/or egress switches can be employed to facilitate selective routing of a vehicle between the straight portion 70c and the angled portion 72c. Some examples of these alternative arrangements are described in U.S. Pat. No. 9,032,880 and U.S. Pat. Pub. No. 2007/0044676.

Referring again to FIG. 1, the track 22 can include a primary transport portion 76 and at least one (alternatively, a plurality of) secondary transport portions 78 that are provided around, and extend from, the primary transport portion 76. The primary transport portion 76 can define a primary path P1 for the vehicles 24. Each of the secondary transport portions 78 can define a secondary path P2 for the vehicles 24 that is intersected by the primary path P1 at an ingress location 80 and an egress location 82. The vehicles 24 can enter and exit each of the secondary transport portions 78 at the associated ingress and egress locations 80, 82, respectively. The vehicles 24 can travel clockwise or counter-clockwise around the primary transport portion 76 and the secondary transport portion(s) 78. In some embodiments, it is possible for some of the vehicles 24 to travel clockwise, and some of the vehicles to simultaneously travel counter-clockwise for a portion of their routes or vice versa, but care must be taken so travel in opposing directions does not result in a collision between the vehicles.

Each of the secondary transport portions 78 can have disposed therealong one or more unit operation stations of any of the types of unit operation stations described in the above definition of "unit operation stations" (and the definitions of transformation and inspection included therein). There can be any suitable number of unit operation stations. Generally, there will be two or more unit operation stations (e.g., 2, 3, 4, 5, . . . up to 100, or more). The unit operation stations may be in any suitable arrangement along the secondary transport portions 78. The unit operation stations can be arranged with a single unit operation station along one or more of the secondary transport portions, or a group of unit operation stations along one or more of the secondary transport portions.

FIG. 1 shows one non-limiting embodiment of an arrangement of unit operation stations on the secondary transport portions 78. In the embodiment shown in FIG. 1, each of the secondary transport portions 78 comprises one of a plurality of container loading stations 84, a plurality of combined filling/capping stations 86, a plurality of decorating stations 88, or a plurality of unloading stations 90 (e.g., collectively "the unit operation stations"). In this embodiment, each of the unit operation stations 84, 86, 88, 90 located at a particular secondary transport portion 78 can be disposed along different unit transport segments 91 that are arranged in parallel. The vehicles 24 can be selectively routed among the secondary transport portions 78 to facilitate bottling of fluent material within a plurality of the containers 38.

For example, when the vehicle 24 is empty (i.e., devoid of a container 38), the vehicle 24 can first be routed to one of the container loading stations 84 where an empty container 38 is loaded onto the vehicle 24. The vehicle 24 can then route the empty container 38 to one of the filling/capping stations 86 where it is filled with fluent material and sealed with one of the closures 40. The vehicle 24 can then route the container 38 to one of the decoration stations 88 to have a decoration applied thereto, and can then route the container 38 to one of the unloading stations 90 where the filled container 38 can be removed from the vehicle 24 for loading into packaging.

It is to be appreciated that there can be significantly more vehicles 24 on the track 22 than are illustrated in FIG. 1. There can also be significantly more vehicles 24 than unit operation stations 84, 86, 88, 90. Each of the vehicles 24 are independently routable along the track 22 to facilitate simultaneous delivery of at least some of the containers 38 to different ones of the unit operation stations 84, 86, 88, 90. The unit transport segments 91 in the embodiment shown in FIG. 1 can have the appearance of rungs on a ladder. The unit transport segments 91 can have a length that is sufficient enough to simultaneously accommodate a plurality of vehicles 24. The different unit transport segments 91 can have the same lengths, or alternatively, different lengths. As such, multiple vehicles 24 can be queued on the unit transport segments 91 awaiting delivery to the associated unit operation station 84, 86, 88, 90. Of course, vehicles can also wait on the side rails of the ladder like structures, but in some cases, this may lead to vehicles blocking other vehicles from reaching downstream unit transport segments 91.

When the vehicles 24 are not stationed at one of the unit operation stations 84, 86, 88, 90, at least one (or more, e.g., 2, 3, 4, 5, . . . up to 100, or more) of the vehicles 24 can continuously circulate around the primary transport portion 76, thus bypassing the secondary transport portions 78 while waiting to be diverted thereto. The primary path P1 can be in the form of a closed loop to facilitate the circulation of the vehicles 24. The primary path P1 may also be described as circuital or continuous. The primary path P1 can be of any suitable configuration. Suitable configurations for the primary path P1 include, but are not limited to: circular paths, elliptical paths, or in a path that comprises both linear portions and curvilinear portions. Non-limiting examples of the latter types of paths include: race track configured paths, generally rectangular paths with rounded corners (as shown in FIG. 1), and other closed loop paths. The primary path P1, of course, is not closed to vehicles entering or leaving the primary path, since it does have ingress and egress portions for container-loaded vehicles to be diverted therefrom onto the secondary paths P2.

Figure 1A:
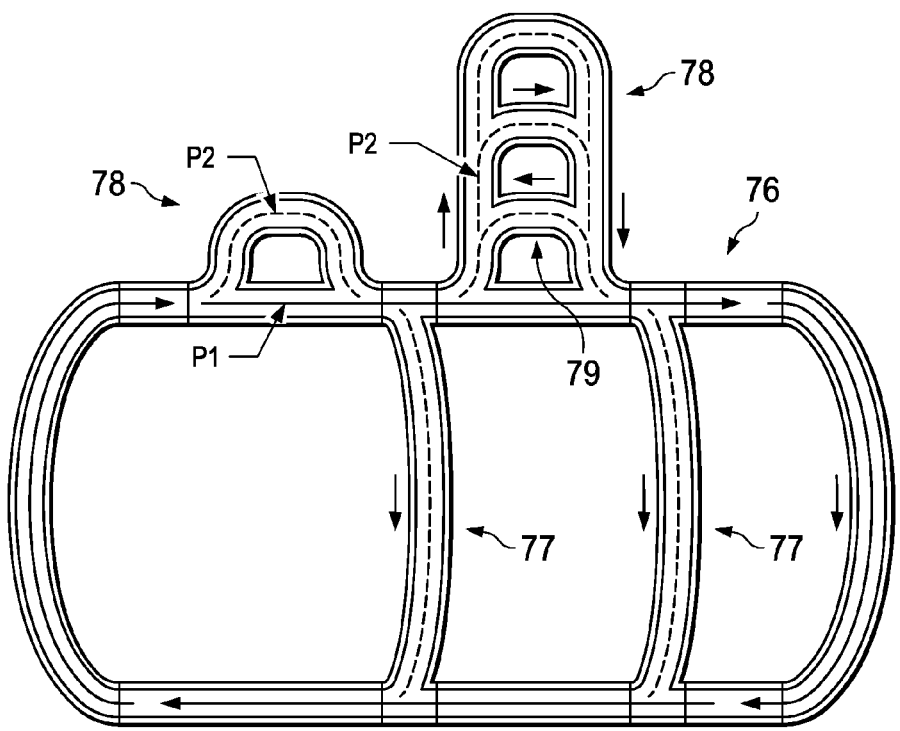
FIG. 1A is a schematic view of a track system having an alternative configuration.

In some cases, as shown in FIG. 1A, the primary path P1 may further comprise one or more sub-loops 77 that are disposed inside of the main closed loop of the primary transport portion 76, and form a path between portions of the main closed loop. The sub-loop 77 may form a path between opposing portions of the main closed loop 76. However, sub-loops 77 may alternatively form a path between non-opposing portions of the main closed loop 76. There are, of course, ingress and egress portions to the sub-loop(s). The sub-loops 77 provide a path for at least some of the container-loaded vehicles to recirculate without traveling completely around the closed loop of the primary path P1.

There can be any suitable number of secondary paths P2 (e.g., 1, 2, 3, 4, 5, . . . up to 100, or more). In some cases, a single secondary path having a ladder configuration (described below), with two rungs may be sufficient. Generally, there will be two or more secondary paths (at least one for filling and one for unloading). When there is more than one secondary path P2, these can be referred to as first, second, third, etc. secondary paths. Similarly, the ingress locations for the secondary paths may be referred to as a first ingress and egress location for the first secondary path; a second ingress and egress location for the second secondary path, etc. Although as shown in FIG. 1, the different secondary paths 78 all have a single type of unit operation station disposed therealong, this is not a requirement. In other embodiments, the types of unit operation stations disposed along one or more different secondary paths 78 may differ. In addition, in some cases a single type of unit operation station can be disposed along more than one secondary path.

The secondary paths P2 can be of any suitable configuration. The secondary paths P2 may be of the same configurations as each other, or of different configurations. If there are more than two secondary paths P2, two of the secondary paths may have the same configuration, and at least one secondary path may have a different configuration. Suitable configurations for the secondary path P2 include, but are not limited to: linear paths, curvilinear paths, or in a path that comprises both linear portions and curvilinear portions.

There are virtually an unlimited number of possible secondary transport portion (and secondary path) configurations. FIGS. 1A to 1D show several of these. An example of a linear path is one such as secondary transport portion 78A shown in FIG. 1B in which the secondary path P2 forms a linear segment that is joined to the primary path P1 at a combined ingress/egress location. The container-loaded vehicle can depart from the primary path P1 to enter such a secondary path P2, and then can re-trace its movement along the linear secondary path P2 to re-enter the primary path P1. Non-limiting examples of secondary paths that comprises both linear portions and curvilinear portions include the generally rectangular paths with rounded corners (as shown in FIG. 1). Such secondary paths may appear to have a ladder configuration in plan view. There can be any suitable number of rungs on the ladders (e.g., 1, 2, 3, 4, 5, or more). The secondary path ingress and egress locations 80 and 82 may be spaced apart as shown in FIG. 1, or in other cases the same (not spaced apart on the primary path) as shown on secondary transport portion 78E in FIG. 1C.

The secondary paths P2 may be in any suitable location relative to the primary path P1. One or more secondary paths P2 may extend outward outside of the closed loop of the primary path P1 as shown in FIG. 1. In other cases, as in the case of secondary transport portion 78F shown in FIG. 1C, one or more secondary paths P2 may be located inside of the closed loop of the primary path P1. In other cases, as in the case of secondary transport portions 78G and 78H shown in FIG. 1C, one or more portions of a secondary path, such as 78H, may extend outside of a secondary transport portion (and if desired, form a ladder off of any side or portion of the same). Further, although in the embodiment shown in FIG. 1, in which the primary path P1 is a generally rectangular path having four sides with rounded corners, and there is one branch of secondary paths P2 on each of the sides of the primary path P1, in other cases, there may be a different arrangement. For example, as shown in FIG. 1A, there can be more than one secondary path P2 extending from one or more of the sides of the primary path P1. In some cases, there may be one or more sides of the primary path P1 with no secondary paths P2 extending therefrom.

FIG. 1A shows that a secondary path 78 (on the upper right portion of FIG. 1A) can optionally be provided with a return loop 79. This secondary path 78 is shown in the form of a ladder with an upper rung and a lower rung. In this case, the upper rung may be a conventional rung in which vehicles can travel in the same direction (clockwise for example) as the travel of vehicles on the primary path 76. Another rung, such as the lower rung, can provide a return loop 79 in which vehicles can travel back to the ingress leg of the ladder in the direction of the arrow. This allows vehicles to be sent through more than one unit operation station on this particular secondary path if desired. This also allows vehicles to be sent through one or more unit operation stations more than once on this particular secondary path if desired.

Figure 1B:
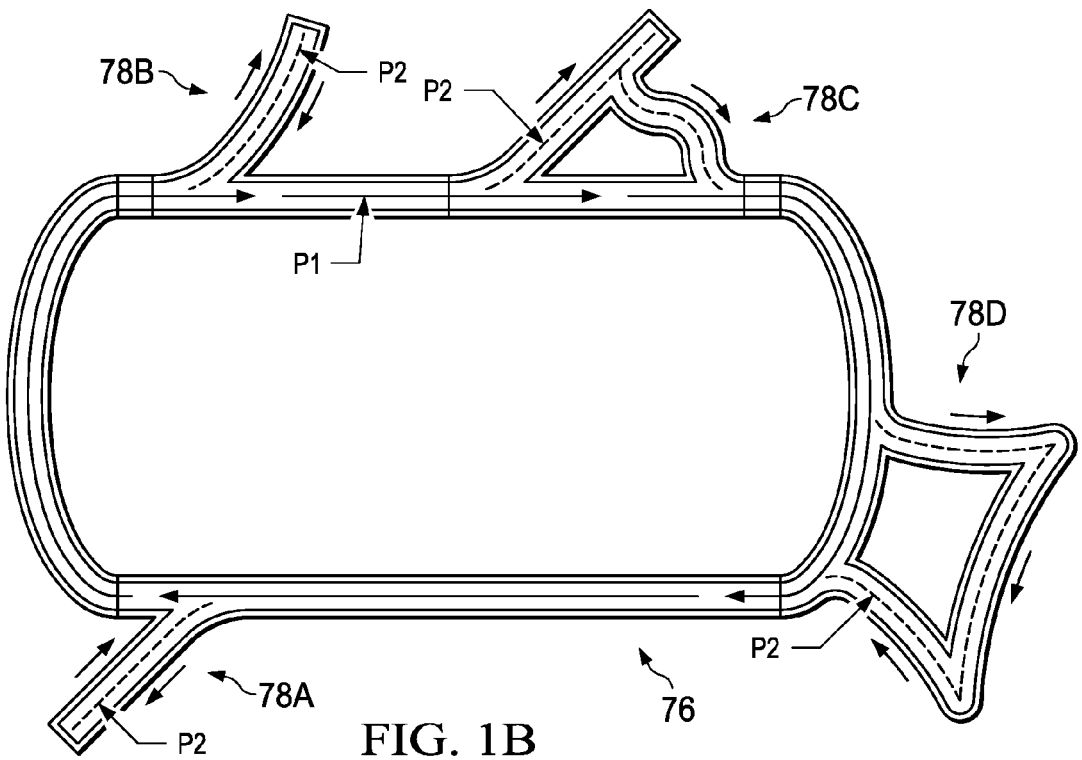
FIG. 1B is a schematic view of a track system having another alternative configuration.
Figure 1C:
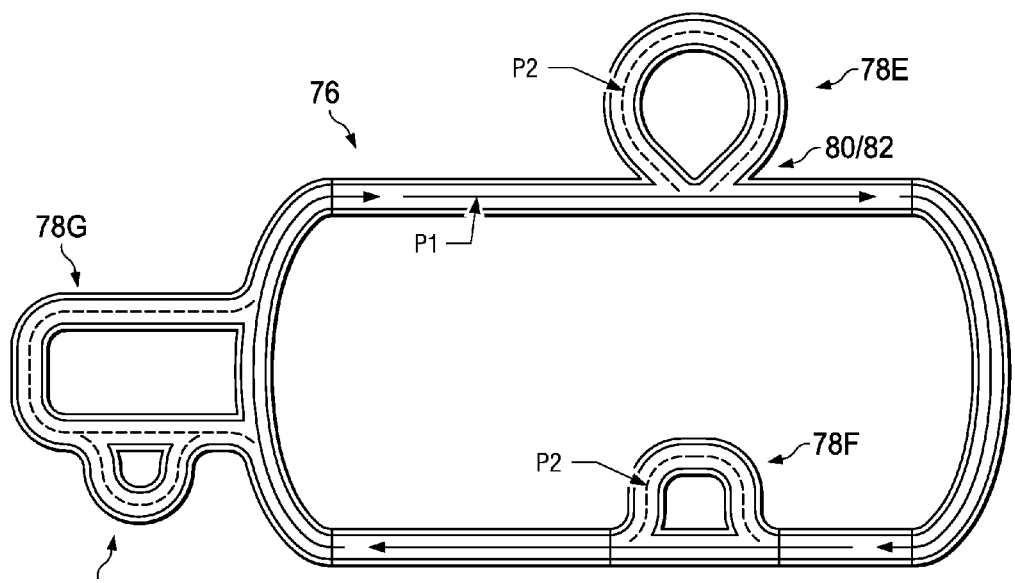
FIG. 1C is a schematic view of a track system having another alternative configuration.

FIG. 1B shows several other secondary path configurations. Secondary path 78B is an example of a secondary path which is similar in function to secondary path 78A, but has a curvilinear configuration. Secondary path 78C contains an additional leg which allows a vehicle to be transported to an egress point that is downstream of the ingress point. A vehicle on secondary path 78C will travel "head first" into the first leg of the secondary path, and then will travel "tail first" when it reverses direction and travels along the second leg of this secondary path. Secondary path 78D contains another additional (third) leg (beyond that of secondary path 78C) which allows a vehicle to be reoriented and travel head first again along this third leg as it proceeds back onto the primary path 76.

Figure 1D:
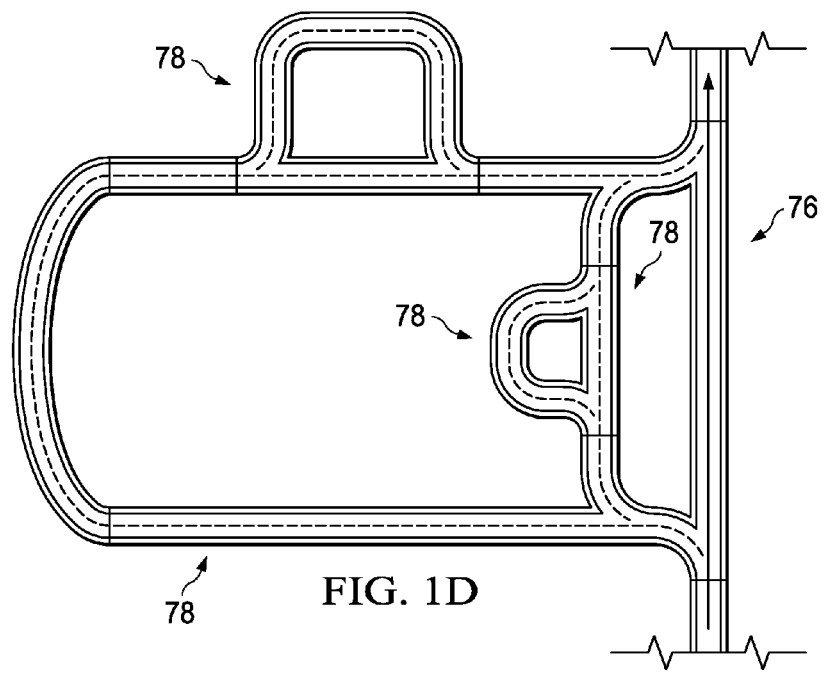
FIG. 1D is a fragmented schematic view of a track system having another alternative configuration.

FIG. 1D shows another secondary path configuration. As shown in FIG. 1D, it is possible for there to be multiple secondary paths that are nested or cascaded in parallel or in series in any suitable manner.

Circulating the vehicles 24 around the primary transport portion 76 can alleviate congestion on the track 22 which can enhance the throughput of the track system 20. For example, when a vehicle 24 is scheduled to be routed to the next unit operation station 84, 86, 88, 90 of its sequence in the course of producing a finished product, and that unit operation station 84, 86, 88, 90 is occupied (i.e., due to other vehicles 24 occupying the unit operation station 84, 86, 88, 90), the vehicle 24 can circulate around the primary transport portion 76 (i.e., in a holding pattern). Once the scheduled unit operation station 84, 86, 88, 90 becomes ready to receive vehicles, the vehicle 24 can then be diverted to the appropriate transport segment 91 of the scheduled unit operation station 84, 86, 88, 90.

It is possible that one or more types of unit operation stations could be located along the primary transport portion 76. However, to alleviate congestion on the primary transport portion 76 and allow one or more of the vehicles 24 to continuously circulate along the primary path P1, the primary transport portion 76 can be devoid of some or all unit operation stations (i.e., 84, 86, 88, 90), and the unit operation stations can instead be located at the secondary transport portions 78, as described above. Alternatively, the primary transport portion 76 may only have fast cycle stations located along the same. The vehicles 24 are therefore diverted off of the primary transport portion 76 to undergo the operations performed by the unit operation station 84, 86, 88, 90 and thus do not interfere with the flow of traffic on the primary transport portion 76. (Of course, in other embodiments, one or more unit operation stations can be located along the primary transport portion 76, and other unit operation stations may be located on the secondary transport portions 78.)

Operating the track system 20 in this manner can allow for more efficient production of filled containers than conventional container filling arrangements. As will be described in further detail below, the control system 62 can coordinate operation of the track 22, routing of each of the vehicles 24, as well as operation of each of the unit operation stations 84, 86, 88, 90 to efficiently and effectively fulfill an order of finished products. The control system is, thus, in communication with the track 22, the vehicles 24, and the unit operation stations 84, 86, 88, 90. The coordination of the operation of these components can include, for example, vehicle identification, vehicle scheduling, collision avoidance, route selection, outage reporting, and the like.

Each of the unit operation stations 84, 86, 88, and 90 in the embodiment shown in FIG. 1 will now be more fully described. The container loading stations (or simply "loading stations") 84 can be configured to facilitate loading of an empty container (e.g., 38) and/or a closure therefor onto a vehicle 24 located at the container loading station 84. It is to be appreciated that the container loading station 84 can comprise any of a variety of automated and/or manual arrangements that facilitate loading of a container and/or a closure onto a vehicle. Loading can be done manually, statically such as by a gravity feed chute with optional gate, or with a mechanical motion device. Suitable mechanical motion devices include, but are not limited to: independently actuatable automatic arms, pneumatic arms, robots, transfer wheels, and other mechanical moving elements. In one embodiment, the container loading stations 84 can each include a robotic arm (not shown) that retrieves the container 38 and/or a closure from a storage area and places the container 38 and/or a closure on the vehicle 24. To facilitate grasping of the containers 38 and/or closures, each robotic arm can have a robotic mandible, a suction end, or any of a variety of suitable additional or alternative arrangements that enable grasping of the containers 38 and/or closures. Once the container 38 and/or a closure are in place on the vehicle 24, a vacuum line (not shown) can be inserted in the primary port 46 (FIG. 2) to draw a vacuum on the vacuum port 44 thereby temporarily securing the container 38 and/or a closure to the vehicle 24. The vacuum line can then be removed from the primary port 46, thereby allowing the associated valve (not shown) to close to maintain the vacuum on the container 38 and/or a closure.

A filling unit operation station is used to dispense fluent material into at least some of the containers. A filling unit operation station is not required to fill the containers to any particular level (such as to a "full" level). The filling unit operation station can dispense any suitable fluent material into the container. In some cases, the filling unit operation station can dispense a composition into the container that comprises all of the ingredients of the finished product. Alternatively, the filling unit operation station can dispense a base composition into the container, and the container can be sent to another filling unit operation station to have other ingredients added thereto in order to form a finished product. Thus, some filling unit operation stations may only dispense portions of the finished product composition. Such portions include, but are not limited to: water, silicone (such as for use as a conditioning agent, or the like), dyes, perfumes, flavors, bleach, anti-foam agents, surfactants, structurants, etc. If the ingredients are separately added, they can be mixed together at any suitable unit operation station.

In addition, although some filling unit operation stations may only be configured to dispense one type of fluent material, the filling unit operation stations are not limited to dispensing only one type of fluent material (e.g., one color of dye, etc.). In some cases, one or more of the filling unit operation stations can be configured to dispense different ingredients (such as through a different fluent material supply and nozzle). For example, the same filling unit operation station could dispense a green finished composition, a blue finished composition, and a red finished composition; or, it could dispense a green dye, a blue dye, and a red dye. In such cases, at least two different types of containers (e.g., a first, a second, a third, etc. container) may receive one or more (or all) of the ingredients for their finished compositions from the same fluent material dispensing unit operation station, or from the same type of fluent material dispensing unit operation station.

A filling unit operation station may, therefore, comprise a plurality of independently controllable nozzles for dispensing fluent material into the containers. Such independently controllable nozzles may take a number of different forms. In some cases, a single nozzle can be used to dispense more than one different fluent material. In other cases, filling unit operation station may comprise a bank of nozzles which comprises a plurality of nozzles, each of which may be configured to dispense the same or different fluent materials. In still other cases, one or more nozzles can be movable upward and downward to accommodate containers of different heights.

Figure 7:
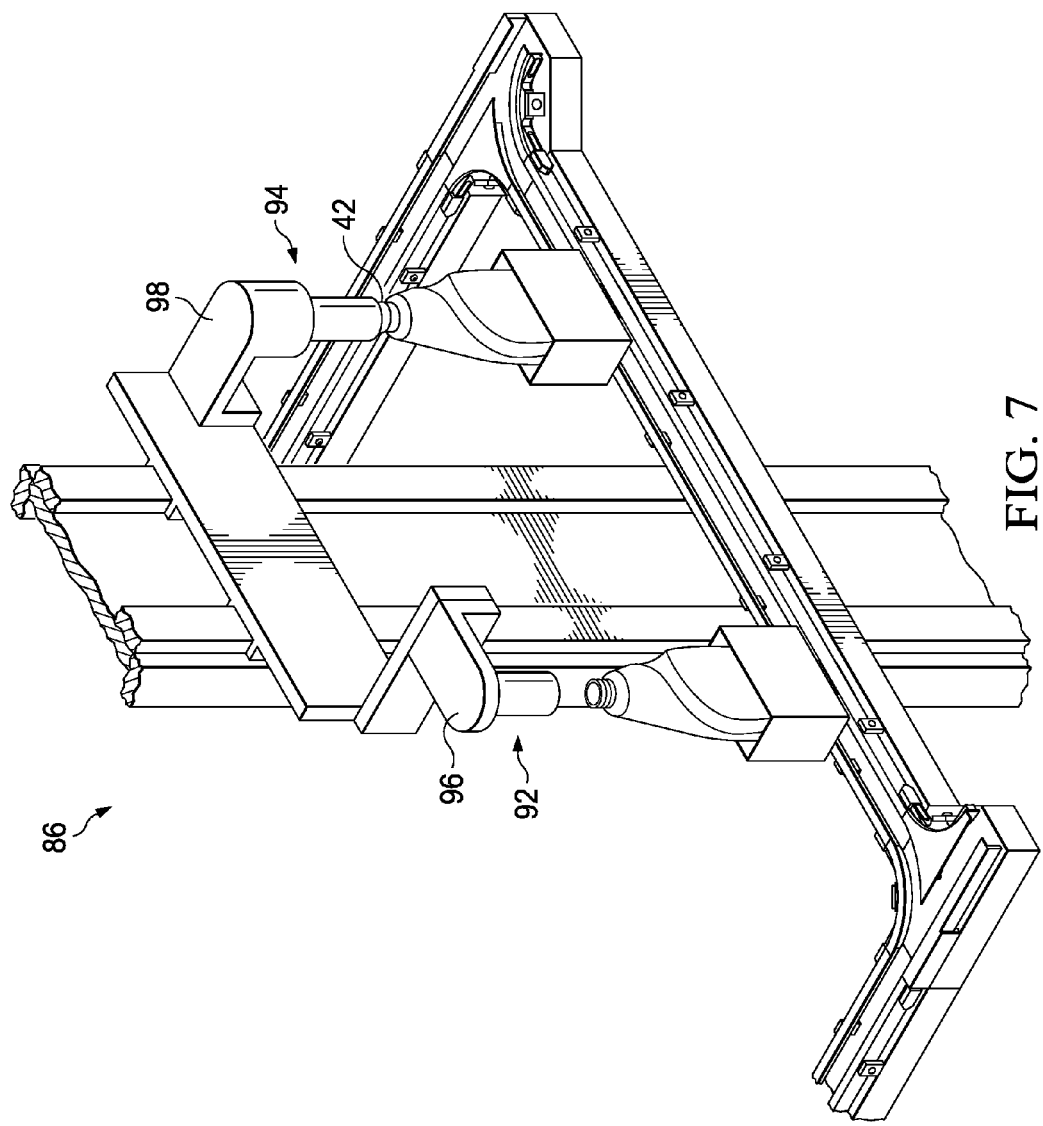
FIG. 7 is an isometric view depicting a filling/capping station of the track of FIG. 1.

The combined filling/capping stations 86 can be configured to dispense fluent material into containers 38 and to apply a closure to the containers 38 once they are filled. One example combined filling/capping station 86 is illustrated in FIG. 7 and is shown to include a filling portion 92 and a capping portion 94. The filling portion 92 can include a filler arm 96 which can move vertically between a retracted position (FIG. 7) and an extended position (not shown). The capping portion 94 can include a capping arm 98 that can move vertically between a retracted position (not shown) and a capping position (FIG. 7). To begin filling the container 38, the vehicle 24 can be routed to the filling portion 92 with the empty container 38 located beneath the filler arm 96. The filler arm 96 can then be moved from the retracted position to the extended position and into engagement with the opening 40 of the container 38. The filler arm 96 can then dispense fluent material into the container 38. Once the fluent material has been dispensed, the filler arm 96 can stop dispensing fluid and can move back to the retracted position. The vehicle 24 can then be routed to the capping portion 94 with the closure 42 positioned beneath the capping arm 98. The capping arm 98 can then extend to the closure 42, grasp the closure 42, and then return to the retracted position. The vehicle 24 can then move the opening 40 of the container 38 beneath the capping arm 98. The capping arm 98 can move to the capping position and can screw, or otherwise attach, the closure 42 to the container 38. The closure 42 may be removable or openable by a consumer to access the contents.

In some embodiments, the closure 42 may be transported on the container 40. In such embodiments, when the vehicle 24 arrives at the filling/capping station 86, the vehicle 24 can first be routed to the capping portion 94. The capping arm 98 can remove the closure 42 from the container 38 and can move to the retracted position while holding the closure 42. The vehicle 24 can then be routed to the filling portion 92 for filling of the container 38 with fluid. Once the container is filled, the vehicle 24 can return to the capping station 94 where the capping arm 98 secures to the closure 42 to the container 38. In other embodiments, the closure 42 can be transported to the filling/capping station 86 on the same vehicle as the container 38, but not on the container (for example, on the same vehicle but adjacent to the container). In other embodiments, the closure 42 can be transported to the filling/capping station 86 on a different vehicle (e.g., a separate vehicle) from the vehicle transporting the container 38. When the closure is transported on a vehicle, it can be held by vacuum (or in some other suitable manner) and sent to any of the finished product unit operation stations, if desired. For example, it may be desirable to send the closure 42 to a decoration station for decorating the closure. In yet other embodiments, the closure 42 might not be transported with the empty container 38, but instead can be provided to the container 38 upon its arrival at the capping portion 94 (i.e., after the container 38 is filled with fluent material). It is to be appreciated that the filling/capping stations 86 can include any of a variety of additional or alternative automated and/or manual arrangements that facilitate filling and capping of a container.

Figure 8:
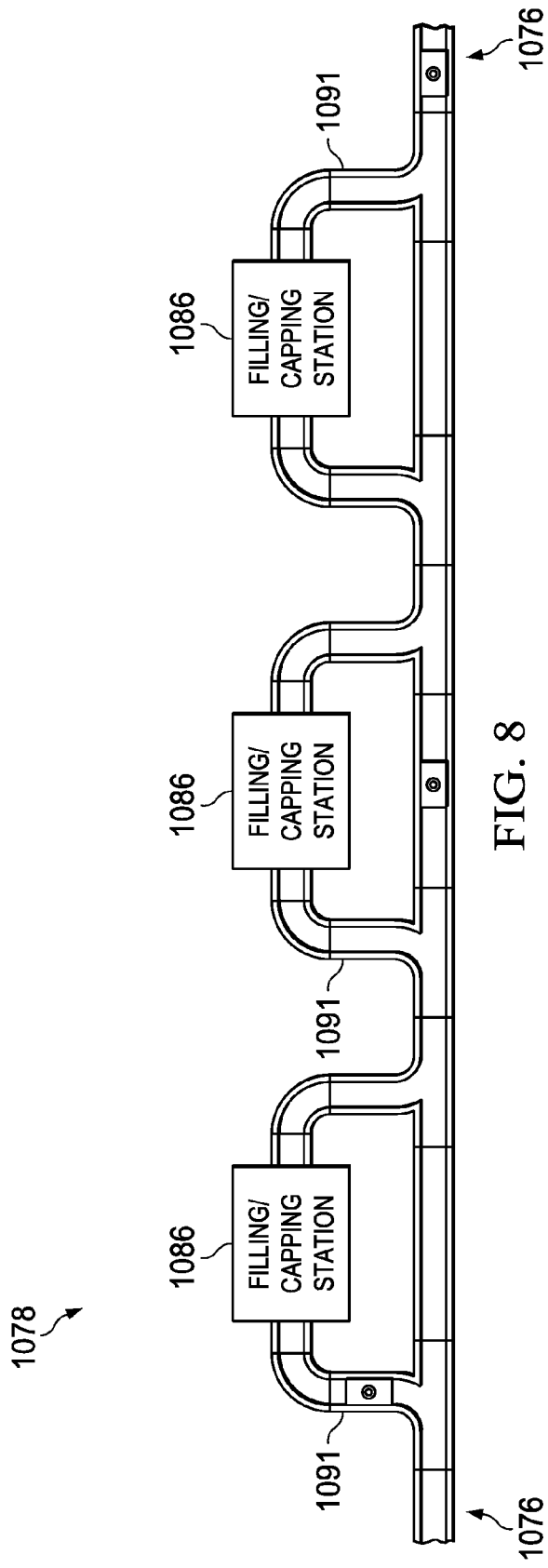
FIG. 8 is an enlarged schematic view of a secondary transport portion, in accordance with another embodiment.

An alternative embodiment of a secondary transport portion 1078 is illustrated in FIG. 8 and is shown to include a plurality of filling/capping stations 1086 that are similar to or the same as in many respects as the filling/capping stations 86 shown in FIGS. 1 and 7 and described above. However, the filling/capping stations 1086 can be disposed along different unit transport segments 1091 that are arranged in series along a primary transport portion 1076 of a track (e.g., 22). It is to be appreciated that the other unit operation stations can additionally or alternatively be disposed along different unit transport segments 1091 that are arranged in series.

The decoration stations 88 can be configured to facilitate labelling, printing, or otherwise decorating the containers 38 (and optionally also doing the same to their closures). In one embodiment, at least one of the decoration stations 88 can include a printer (not shown) that prints labels for application to the containers 38. In such an embodiment, the printer can print the label on a sticker that is on a backing substrate. A spooling assembly (not shown) can receive the sticker and the backing substrate. When the vehicle 24 carrying the container 38 passes the spooling assembly, the movement of the container 38 past the spooling assembly can facilitate application of the sticker to the container 38. In other embodiments, the printer can print ink onto a transfer component, and an adhesive can be applied onto the ink to form a composite structure. The ink and adhesive composite structure can then be transferred from the transfer component onto the container to form a label or decoration (without using a separate sticker). Such arrangements can facilitate "on-demand" printing of labels whereby different labels can be printed for the different types of containers 38 and/or fluids that are being carried by the vehicles 24. These labels can include various types of decorations and product information such as, for example, characters, graphics, branding, ingredients, SKU information, or other visual elements for when the container 38 is displayed for sale. If desired, the containers can even be personalized for and/or in response to orders from retailers or from individual consumers.

The unloading stations 90 can be configured to facilitate removal of the filled containers 38 from the vehicles 24. In one embodiment, each of the unloading stations 90 can include a robotic arm (not shown) that retrieves the container 38 from each vehicle 24 for loading into packaging (e.g., a store display or a shipping container). To facilitate grasping of the container 38, the robotic arm can have a robotic mandible, a suction end, or any of a variety of suitable additional or alternative arrangements that enable grasping of the container 38. Once the container 38 is removed from the vehicle 24, the vehicle 24 can be routed to the container loading station 84 to receive another empty container 38 for filling. It is to be appreciated that the unloading station 90 can include any of a variety of additional or alternative automated and/or manual arrangements that facilitate unloading of a container into packaging.

In some embodiments, the containers 38 can be provided into packaging that is designed to present the containers 38 for sale at a merchant. In such packaging, the containers 38 can be offered for sale individually or packaged with one or more other containers or products, which together form an article of commerce. The containers 38 can be offered for sale as a primary package with or without a secondary package. The containers 38 can be configured to be displayed for sale while lying down or standing up on a store shelf, while presented in a merchandising display, while hanging on a display hanger, or while loaded into a display rack or a vending machine. When the containers 38 are for fluent product(s), they can be configured with a structure that allows them to be displayed in any of these ways, or in any other way known in the art, as intended, without failure. In some embodiments, the unloading stations 90 can facilitate packaging ("bundling") of different types of containers and/or fluent materials within the same packaging without requiring manual handling of the containers 38 as is oftentimes required in conventional operations.

The track system 20 can comprise any suitable number and/or type of inspection station(s). For example, in FIG. 1, the track system 20 can include a first scanner 100 and a second scanner 102 that are each configured to scan passing containers 38. The first scanner 100 can be located between one of the ingress locations 80 and the filling/capping station 86 and can scan each passing vehicle 24 to determine if the container 38 is present. The second scanner 102 can be located between the decoration stations 88 and the unloading stations 90 and can scan each passing vehicle 24 to determine whether the container 38 disposed thereon is ready for packaging by the unloading stations 90.

If the container 38 is not ready for packaging by one of the unloading stations (such as due to a defect in the contents and/or the container), the container can be unloaded at the unloading station of its destination. In other cases, the vehicle with the container thereon can be sent to an alternative unloading station. At the destination or alternative unloading station, one or more of the following actions can take place: the defect in the container and/or its contents can be remedied; the container can be emptied and recycled; and/or the container and/or its contents can be disposed of. The container is unloaded from the unloading station, and the vehicle becomes ready for a new route assignment.

The first and second scanners 100, 102 can be any of a variety of scanners for obtaining information from the vehicles 24 and/or the containers 38 such as, for example, an infrared scanner. The first and second scanners 100, 102 can also be configured to facilitate reading of a variety of data from the container 38 such as QR codes or UPC barcodes, for example.

It is to be appreciated that the track system 20 can facilitate dispensing different types of fluent materials into various types of different containers at the same time. (Of course, the start time and finish time of dispensing into the different containers may, but need not, coincide exactly. The dispensing into the different containers may only at least partially overlap in time.)

In addition, in some cases, one or more containers may not be filled with fluent material that is used to make a finished product. For example, one or more containers may be used to receive fluent material that is cleaned or flushed from one or more nozzles at a filling unit operation station, and this fluent material can thereafter be disposed of or recycled.

As will be described in more detail below, the particular container types and fluent materials provided for each vehicle 24 can be selected by the control system 62 to fulfill a particular production schedule, and each vehicle 24 can be independently and simultaneously routed along a unique route among the unit operation stations (such as 84, 86, 88, 90) to facilitate loading and filling of the containers 38. The unique route for each vehicle 24 can be selected by the control system 62 based, at least in part, upon the vehicle type (i.e., the type of container or containers the vehicle 24 is configured to accommodate), the unique routes selected for the other vehicles 24, and/or the type of finished product(s) needed by the unloading station 90 for packaging, for example. It is to be appreciated that the track system 20 can facilitate filling of different types of containers with different types of fluid more efficiently and effectively than conventional arrangements. For example, conventional arrangements, such as linear motor filling lines, typically only allow for filling of one type of container with one type of fluid at a time. As such, individual systems are oftentimes required for each container and fluid being manufactured which can be expensive and time consuming. In addition, converting these systems to use a different container and/or fluid can also be expensive and time consuming. The track system 20 can therefore be a solution that allows for manufacture of different types of filled containers less expensively and in a less time consuming manner than these conventional arrangements.

It should be understood that the operations that take place at the different unit operation stations may take the same amount of time, but often do not. These time periods may be referred to as a first duration, a second duration, a third duration, etc. The first, second, third, etc. durations can be the same, or one can be greater than the other(s). For instance, some unit operation stations perform operations that are relatively fast compared to other unit operation stations; some unit operation stations may be relatively slow; and, some unit operation stations may carry out some operations that are relatively fast and some that are slower (e.g., a filling station that can dispense one ingredient and that can also dispense a larger quantity comprising a complete composition). Therefore, although FIG. 1 shows an equal number of filling/capping unit operation stations and decoration stations, this is not required. Thus, the system may, for example, have fewer of the relatively fast unit operation stations than the slower unit operation stations.

It should also be understood that the time it takes to create different types of finished products from start to finish (throughput time) may be the same, or different for the different types of finished products. The time it takes to create finished products may also be the same, or different for the same types of finished products. The time it takes to create finished products can be measured beginning at a starting point that occurs when an empty container arrives at a loading station and ends at a destination point when the finished product is unloaded at an unloading station.

Figure 9:
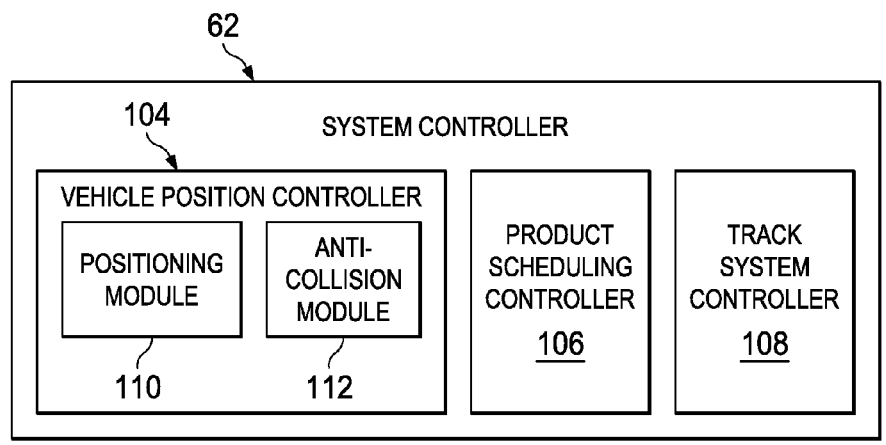
FIG. 9 is a schematic view of the control system of FIG. 1.

Referring now to FIG. 9, the control system 62 can include a vehicle position controller 104, a product scheduling controller 106, and a track system controller 108, that are communicatively coupled with each other and can cooperate to facilitate producing finished products. The vehicle position controller 104 can include a positioning module 110 and an anti-collision module 112. The positioning module 110 can facilitate positioning of the vehicles 24 at designated locations along the track 22. Each of the vehicles 24 can have a unique identifier associated with it (uniqueness only needs to be relative to the other vehicles on the track) and with which the vehicle positioning module 110 can identify it. As will be described in further detail below, the vehicle position controller 104 can receive desired location coordinates from the track system controller 108 for the vehicles 24. The vehicle position controller 104 can move the vehicles 24 along the track 22 based upon the location coordinates for each vehicle 24.

The control system 62 can be any suitable computing device or combination of computing devices (not shown), as would be understood in the art, including without limitation, a custom chip, an embedded processing device, a tablet computing device, a personal data assistant (PDA), a desktop, a laptop, a microcomputer, a minicomputer, a server, a mainframe, or any other suitable programmable device. In various embodiments disclosed herein, a single component can be replaced by multiple components and multiple components can be replaced by a single component to perform a given function or functions. Except where such substitution would not be operative, such substitution is within the intended scope of the embodiments.

The computing device can include a processor that can be any suitable type of processing unit, for example a general purpose central processing unit (CPU), a reduced instruction set computer (RISC), a processor that has a pipeline or multiple processing capability including having multiple cores, a complex instruction set computer (CISC), a digital signal processor (DSP), an application specific integrated circuit (ASIC), a programmable logic devices (PLD), and a field programmable gate array (FPGA), among others. The computing resources can also include distributed computing devices, cloud computing resources, and virtual computing resources in general.

The computing device can also include one or more memories, for example read only memory (ROM), random access memory (RAM), cache memory associated with the processor, or other memories such as dynamic RAM (DRAM), static ram (SRAM), programmable ROM (PROM), electrically erasable PROM (EEPROM), flash memory, a removable memory card or disk, a solid state drive, and so forth. The computing device can also include storage media such as a storage device that can be configured to have multiple modules, such as magnetic disk drives, floppy drives, tape drives, hard drives, optical drives and media, magneto-optical drives and media, compact disk drives, Compact Disk Read Only Memory (CD-ROM), Compact Disk Recordable (CD-R), Compact Disk Rewriteable (CD-RW), a suitable type of Digital Versatile Disk (DVD) or BluRay disk, and so forth. Storage media such as flash drives, solid state hard drives, redundant array of individual disks (RAID), virtual drives, networked drives and other memory means including storage media on the processor, or memories are also contemplated as storage devices. It can be appreciated that such memory can be internal or external with respect to operation of the disclosed embodiments. It can be appreciated that certain portions of the processes described herein can be performed using instructions stored on a computer-readable medium or media that direct a computer system to perform the process steps.

Non-transitory computer-readable media, as used herein, comprises all computer-readable media except for transitory, propagating signals.

Network and communication interfaces can be configured to transmit to, or receive data from, other computing devices across a network. The network and communication interfaces can be an Ethernet interface, a radio interface, a Universal Serial Bus (USB) interface, or any other suitable communications interface and can include receivers, transmitters, and transceivers. For purposes of clarity, a transceiver can be referred to as a receiver or a transmitter when referring to only the input or only the output functionality of the transceiver. Example communication interfaces can include wired data transmission links such as Ethernet and TCP/IP. The communication interfaces can include wireless protocols for interfacing with private or public networks. For example, the network and communication interfaces and protocols can include interfaces for communicating with private wireless networks such as a WiFi network, one of the IEEE 802.11x family of networks, or another suitable wireless network. The network and communication interfaces can include interfaces and protocols for communicating with public wireless networks, using for example wireless protocols used by cellular network providers, including Code Division Multiple Access (CDMA) and Global System for Mobile Communications (GSM). A computing device can use network and communication interfaces to communicate with hardware modules such as a database or data store, or one or more servers or other networked computing resources. Data can be encrypted or protected from unauthorized access.

In various configurations, the computing device can include a system bus for interconnecting the various components of the computing device, or the computing device can be integrated into one or more chips such as a programmable logic device or application specific integrated circuit (ASIC). The system bus can include a memory controller, a local bus, or a peripheral bus for supporting input and output devices, and communication interfaces. Example input and output devices include keyboards, keypads, gesture or graphical input devices, motion input devices, touchscreen interfaces, one or more displays, audio units, voice recognition units, vibratory devices, computer mice, and any other suitable user interface.

The processor and memory can include non-volatile memory for storing computer-readable instructions, data, data structures, program modules, code, microcode, and other software components for storing the computer-readable instructions in non-transitory computer-readable mediums in connection with the other hardware components for carrying out the methodologies described herein. Software components can include source code, compiled code, interpreted code, executable code, static code, dynamic code, encrypted code, or any other suitable type of code or computer instructions implemented using any suitable high-level, low-level, object-oriented, visual, compiled, or interpreted programming language.

Referring again to FIG. 9, to facilitate routing of the vehicles 24 along the track 22, the vehicle position controller 104 can control operation of the plurality of coils 58a and the transition portions 50c (e.g., the flipper members 74). The vehicle position controller 104 can also prevent collisions between the vehicles 24 as they are positioned along the track 22. For example, the vehicle position controller 104 can track the positions and/or speed of the vehicles 24 on the track 22. If a vehicle 24 begins approaching another vehicle 24 in a manner that could cause a collision, the vehicle position controller 104 can adjust the speed (increasing or decreasing the speed) of the approaching vehicle 24 and/or the approached vehicle 24 to prevent a collision. It is to be appreciated that the vehicle position controller 104 can be an on-board controller that is original to the track 22 and built together with the track 22. In one embodiment, the vehicle controller 104 can be provided with the track from the manufacturer of the track 22 (e.g., MagneMotion, Inc. of Devens, Mass., U.S.A.).

The product scheduling controller 106 can be configured to assign a container type and fluent material type (e.g., a finished product) for each empty vehicle 24. The product scheduling controller 106 can also be configured to assign a desired route that achieves the assigned finished product. The track system controller 108 can be configured to route the vehicles 24 around the track 22 and operate the unit operation stations 84, 86, 88, 90 based upon the finished product and route assigned to the vehicles 24.

The control system 62 may be configured as a central assignment mechanism that pre-assigns independent routes for the vehicles based on demand data. The control system 62: receives demand for finished products to be made on the track system; determines a route for a vehicle, wherein the route is determined based on a status of one or more unit operation stations; and causes a vehicle to be propelled to progress along the determined route to create one or more of the demanded finished products, and delivers the finished products to an unloading station. It should be understood that these steps can be taking place in the above order, or in any order, provided that at least some demand for finished products to be made is first received. Generally, when there are multiple vehicles being routed, the control system can be performing such steps for the different vehicles. These vehicles may be at different stages of going through these steps at any given time (and the control system can be executing any of these steps for the various vehicles at any given time).

The status of the unit operation station(s) can comprise: (a) the state of readiness of a unit operation station (whether the unit operation station is broken down, or not); (b) one or more capabilities of the unit operation station (that is, a description of the unit operation(s)); (c) information concerning operations expected or scheduled to be completed at one or more unit operation stations in the future (including the progress of other vehicles along their routes); (d) information concerning the capacity utilization of the unit operation station (that is, how much of its capacity is used relative to its full capacity, or conversely how often it is idle relative to its full capacity); (e) information concerning the capacity utilization of other unit operation stations (utilization of other unit operation stations (similar or dissimilar)); (f) information concerning the availability of raw materials (e.g., fluent material(s), labels, etc.) to the unit operation station; and (g) information concerning expected maintenance activities involving the unit operation station.

The determined route may, in some cases, have one or more constraints on arriving at one or more unit operation stations before one or more other vehicles or after one or more other vehicles. In other cases, the determined route may not have any constraints on arriving at one or more unit operation stations before one or more other vehicles or after one or more other vehicles. The determined route is determined based on status information of a vehicle. Such status information may include: the vehicle's container-holding interface type, maximum velocity of the vehicle, maximum acceleration of the vehicle, maximum container weight that can be held by the vehicle, maximum container size, and any other relevant information about the vehicle. The determined route can be selected from a subset of all possible routes, and more particularly is selected from a set of all possible routes that will result in creating a demanded finished product. The determined route is selected by comparing potential routes where such comparison takes into account the utilization or capacity of one or more unit operation stations and the selected route may be selected to best utilize the capacity of one or more unit operation stations.

The determined route may take into consideration the routes assigned to other vehicles 24, including the extent to which the other vehicles have actually progressed along their planned routes, so as to avoid congestion caused by excessive vehicles reaching a similar location at a similar time, and so as to ensure vehicles will arrive in a desired sequence where appropriate.

The determined route may be determined using an algorithm (described as follows), where the algorithm may comprise a recursive method so as to be applicable to a wide range of track configurations and unit operation station configurations without requiring modifications to the algorithm's recursive method. The algorithm may implement a system where unit operation stations demand partially or completely finished products from other unit operation stations so as to enable the unit operation stations to contribute towards creating finished products specified in the step of receiving demand for finished products to be made. The demand from the unit operation stations may describe needed products and times when those products may be needed. (The loading unit operation stations will, however, typically receive demand for vehicles, rather than partially or completely finished products.) The demand from the unit operation stations makes it possible for the route-determining algorithm to only consider routes connecting unit operation stations with appropriate demand, substantially reducing the time and processing power required to determine a route as compared to an algorithm that would evaluate the merits of every possible way to route a vehicle along the track. Such an algorithm could solve the problem of determining a best route from many possible ways to route a vehicle along a track (100 billion, 1 trillion, or many more ways being possible in some embodiments) in a short period of time (e.g., less than one second), or a very short period of time (100 milliseconds, 50 milliseconds, 5 milliseconds, or less in some embodiments). Such an algorithm may take the form of several embodiments, some of which may also assign a quantity or priority to the demanded products at unit operation stations.

An example of the vehicle position controller 104, the product scheduling controller 106, and the track system controller 108 cooperating to create a finished product will now be described. First, when the vehicle 24 is empty (either due to system start-up or being emptied at the unloading station), the track system controller 108 can request, from the product scheduling controller 106, the next finished product to be assigned to the vehicle 24. The product scheduling controller 106 can assign a finished product to the vehicle 24 and can provide the desired route for the vehicle 24 to take to complete the finished product. The track system controller 108 can then provide coordinates to the vehicle position controller 104 that will route the vehicle 24 to one of the container loading stations 84. The vehicle position controller 104 then routes the vehicle 24 to the container loading station 84 (via the designated coordinates) and notifies the track system controller 108 when the vehicle 24 has reached its destination. The track system controller 108 can then facilitate operation of the container loading station 84. After the container 38 is loaded onto the vehicle 24, the track system controller 108 can provide coordinates to the vehicle position controller 104 that will route the vehicle 24 to one of the filling/capping stations 86. The vehicle position controller 104 then routes the vehicle 24 to the filling/capping station 86 (via the designated coordinates) and notifies the track system controller 108 when the vehicle 24 has reached its destination. The track system controller 108 can then facilitate operation of the filling/capping station 86. After the container 38 is filled and capped, the track system controller 108 can provide coordinates to the vehicle position controller 104 that will route the vehicle 24 to one of the decoration stations 88. The vehicle position controller 104 then routes the vehicle 24 to the decoration station 88 (via the designated coordinates) and notifies the track system controller 108 when the vehicle 24 has reached its destination. The track system controller 108 can then facilitate operation of the decoration station 88. After the container 38 is decorated, the track system controller 108 can provide coordinates to the vehicle position controller 104 that will route the vehicle 24 to one of unloading stations 90. The vehicle position controller 104 then routes the vehicle 24 to the unloading station 90 (via the designated coordinates) and notifies the track system controller 108 when the vehicle 24 has reached its destination. The track system controller 108 can then facilitate operation of the unloading station 90. After the container 38 is removed from the vehicle 24, the track system controller 108 can request, from the product scheduling controller 106, the next finished product to be assigned to the vehicle 24.

In some embodiments, the track system controller 108 can deviate the vehicle 24 from the desired path (assigned by the product scheduling controller 106) to overcome certain problems, such as a traffic jam, sequencing violation (sequencing is described below), and/or a defect or reject condition (e.g., bottle missing, cap missing, cap misaligned, etc.). The deviated path can be determined by the product scheduling controller 106 and/or the track system controller 108.

It is to be appreciated that the vehicle position controller 104, the product scheduling controller 106, and the track system controller 108 can facilitate simultaneous routing of the vehicles 24 around the track 22 such that the containers 38 are at various stages of production. To facilitate effective and efficient simultaneous routing of the vehicles 24, the vehicle position controller 104, the product scheduling controller 106, and the track system controller 108 can share information about the vehicles 24 and/or containers 38. For example, the track system controller 108 can share, with the product scheduling controller 106, the positions of the vehicles 24, the production status of each container 38, and/or any route deviations. The product scheduling controller 106 can share, with the track system controller 108, the finished product and route assignments for the vehicles 24.

As described above, the product scheduling controller 106 can assign a container type, a closure type, a fluent material type, a decoration type, and a route for each empty vehicle 24 identified by the track system controller 108. It is to be appreciated that although this embodiment describes assignment of a container type, a closure type, a fluent material type, and a decoration type, other embodiments may specify other finished product attributes. Other finished product attributes may include values related to the dimensions of a container or any part or parts thereof, values related to the mass of one or more parts of the product at one or more stages of completion including the finished product, fill quantity or level, or additional attributes similar to those previously or subsequently described such as a front label type and a back label type. Still more other finished product attributes may include targets or acceptable ranges of values for any one or more of the aforementioned finished product attributes or other finished product attributes. Furthermore, other finished product attributes may include parameters related to setup of unit operation stations to be used during operating on the finished product specified (for example, bottle height will dictate the height to which a filler nozzle will be adjusted).

Figure 12:
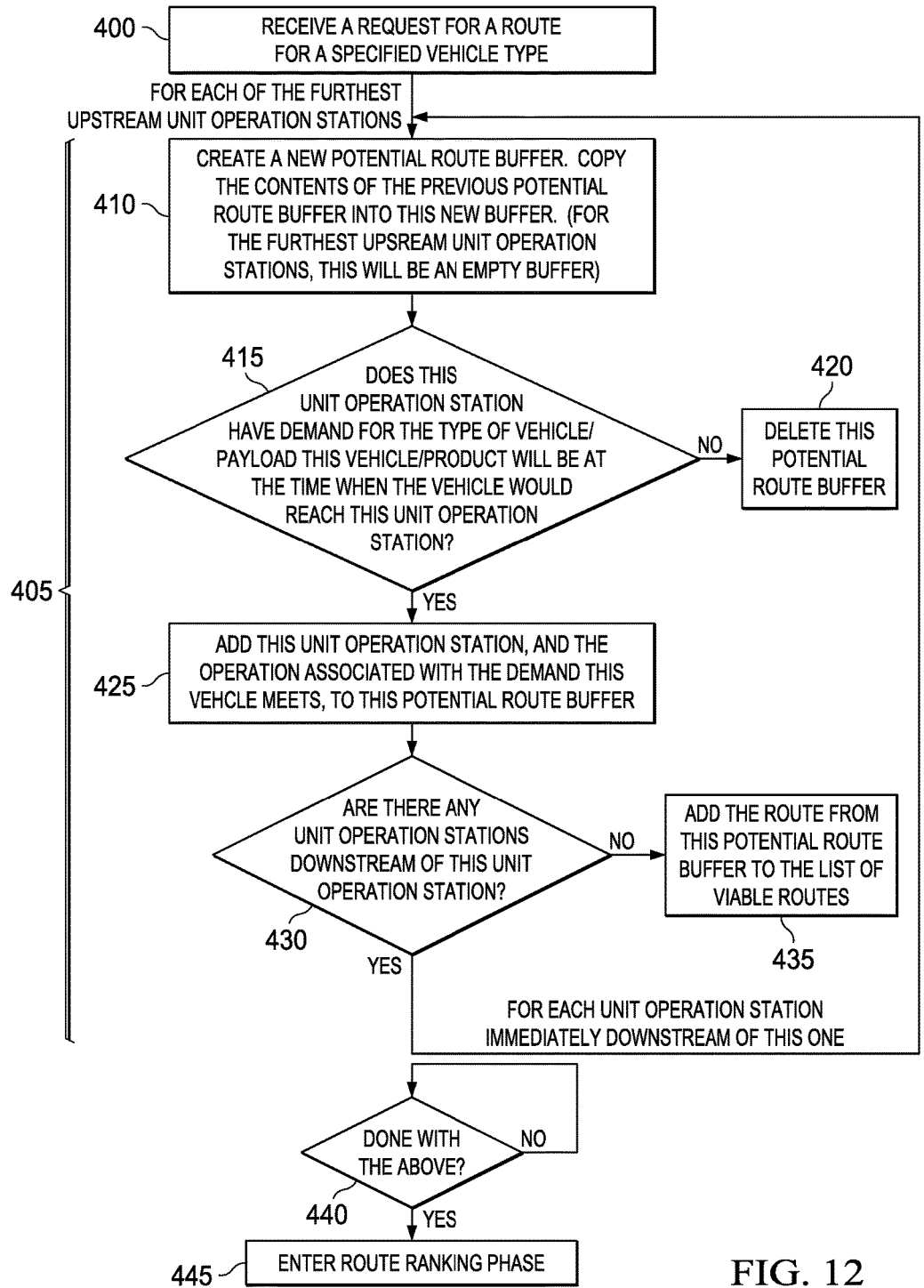
FIG. 12 is a flow chart depicting an Effective Route Identification Phase of the control routine implemented by the control system of FIG. 1, according to one embodiment.
Figure 13A:
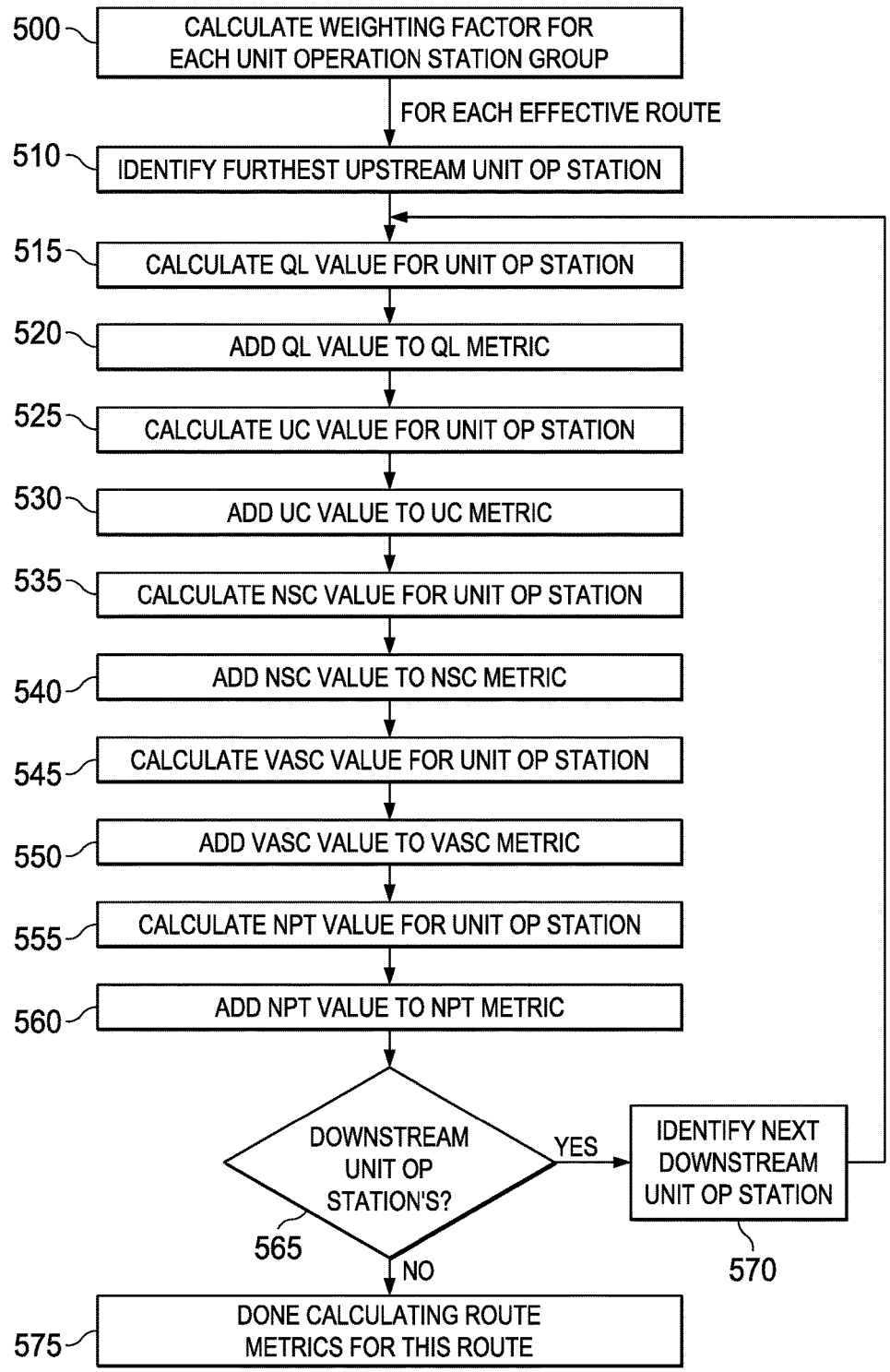
FIGS. 13A and 13B are flow charts depicting parts of a Route Ranking Phase of the control routine implemented by the control system of FIG. 1, according to one embodiment.
Figure 13B:
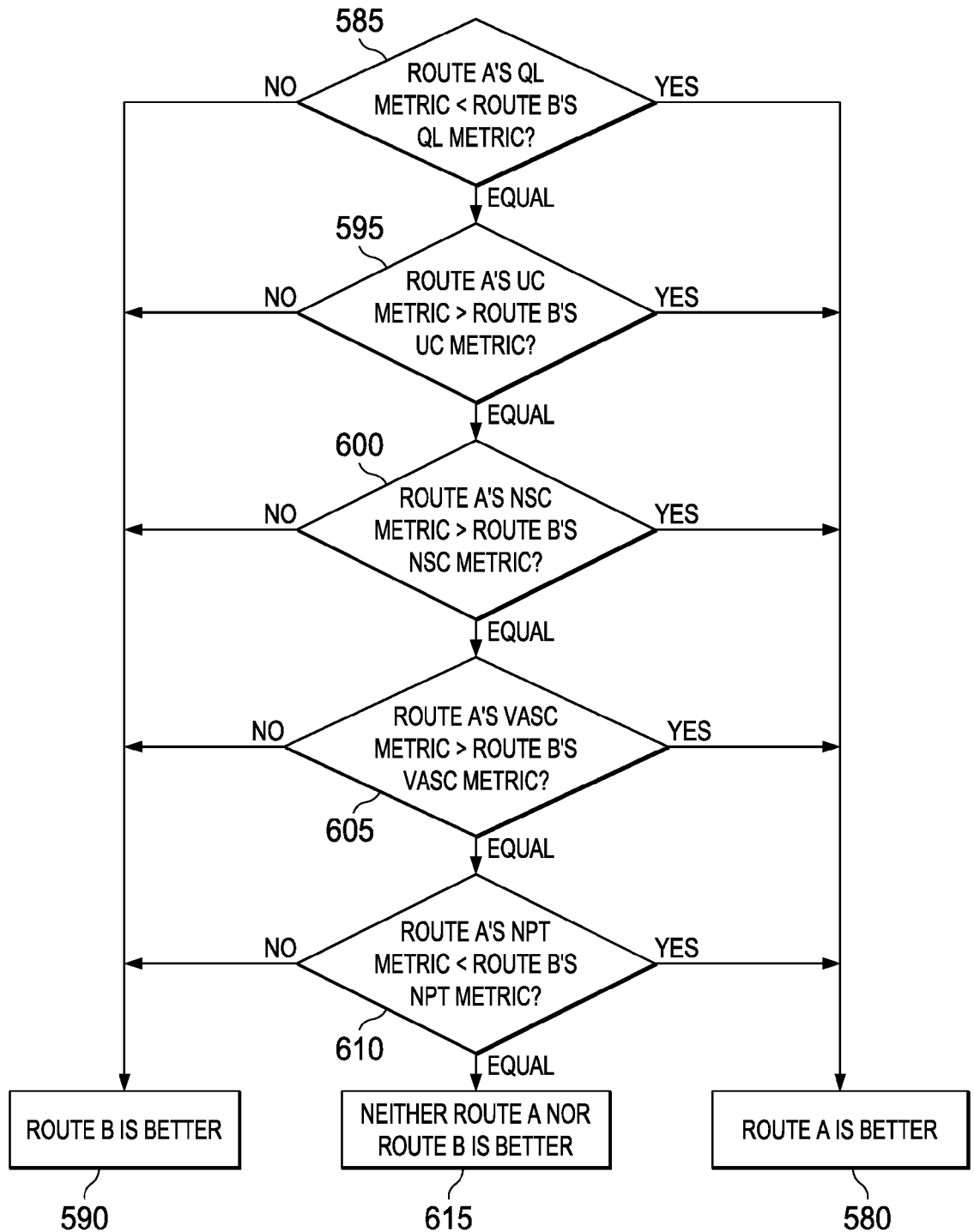

One embodiment of a control routine implemented by the product scheduling controller 106 in assigning a container type, a closure type, a fluent material type, a decoration type, and a route for each empty vehicle 24 is generally illustrated in FIGS. 10, 11, 12, 13A, and 13B which will now be discussed. The product scheduling process can be separated into four phases—a Sequencing Phase (FIG. 10), a Demand Propagation Phase (FIG. 11), an Effective Route Identification Phase (FIG. 12), and a Route Ranking Phase (FIGS. 13A and 13B). Generally, during the Sequencing Phase, production schedules can be assigned to each unloading station 90. During the Demand Propagation Phase, unit operation stations are identified that have or will have demand so as to contribute to one or more of the finished products specified by each unloading station's 90 production schedule. During the Effective Route Identification Phase, a plurality of effective routes for the current vehicle 24 are identified based on the unit operation stations' demand information. During the Route Ranking Phase, the best route and related finished product can be selected from the plurality of effective routes that are generated during the Effective Route Identification Phase.

Figure 10:
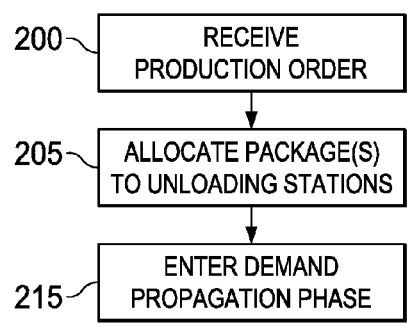
FIG. 10 is a flow chart depicting a Sequencing Phase of a control routine implemented by the control system of FIG. 1, according to one embodiment.
Figure 11:
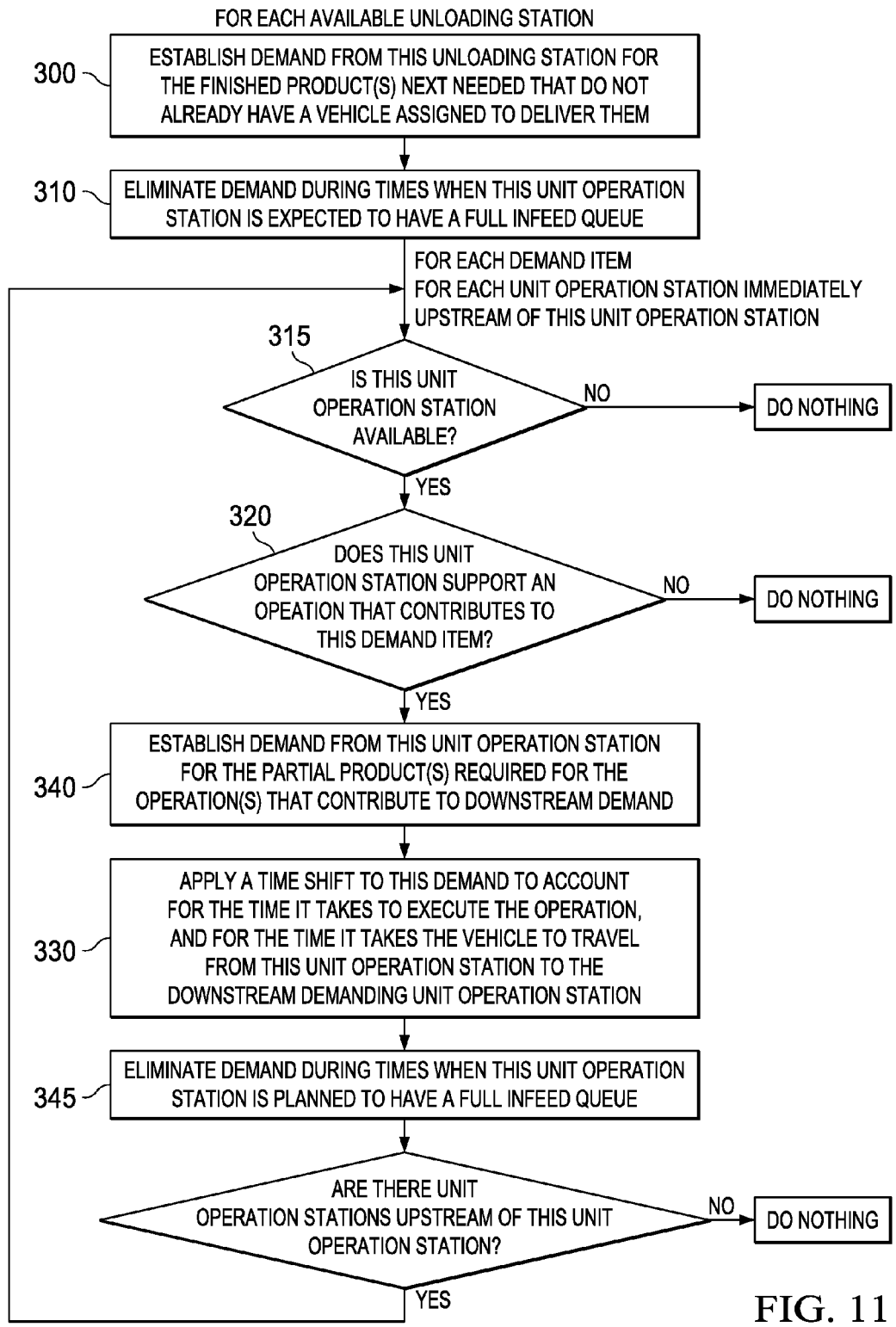
FIG. 11 is a flow chart depicting a Demand Propagation Phase of the control routine implemented by the control system of FIG. 1, according to one embodiment.

Referring now to FIG. 10, the Sequencing Phase will now be discussed in greater detail. First, a production order can be provided to the product scheduling controller 106 (step 200). The production order can include the quantity of packages that are desired and the types of finished products that are to be provided in each package. Each package may include different types and/or quantities of finished products. In describing the types of finished products that are to be provided within a package, the production order may additionally specify sequencing information. This sequencing information may either specify an explicit sequence of arrival of products, or specify that the sequence of product arrivals for the package is unimportant, or specify a combination thereof in which for example one or more first products must arrive before one or more second products but in any sequence with respect to one or more third products. In one embodiment, the production order can be generated from a customer order that is received at an upstream computer system (e.g., from a procurement software program). The upstream computer system can convey the production order to the product scheduling controller 106 which can then allocate packages to the unloading stations 90 for fulfillment (205). Packages are assigned to an unloading station 90 in a specific sequence, thusly establishing a production schedule for each unloading station 90. This sequence specifies the order of production of packages at each unloading station 90, but does not specify the sequence of production of packages by the overall track system 20.

To further explain using a specific example, if a production order describes packages 1, 2, 3, 4, 5, and 6, packages may be assigned to a first unloading station 90 in the sequence of 2, 1, 5, and packages may be assigned to a second unloading station 90 in the sequence of 3, 6, 4, but the track system 20 may produce the packages in order 2, 1, 3, 5, 6, 4 or order 2, 3, 1, 6, 5, 4 or order 3, 6, 4, 2, 1, 5 or any other order that does not violate the package sequencing of a particular unloading station 90. It should be noted that in the previously described specific example, even though package production is described as a sequenced process, finished products feeding multiple packages can be produced simultaneously, such that more than one package is in the process of being produced at the same time, so the sequence described refers to the completion of the process of producing a package, and it is possible that more than one package may be completed at nearly the exact same moment in time.

Once at least one of the unloading stations 90 has been assigned a package, the track system controller 108 can select a vehicle 24 for assignment of a route and associated finished product thereto (the current vehicle). The vehicle 24 can be selected from among a plurality of vehicles 24 on the track 22 (e.g., when the track system 20 is first initialized/started up) or when the vehicle 24 has completed the previously assigned finished product (e.g., after leaving the unloading station 90). Most typically, the selected vehicle is empty. In some cases, however, a vehicle 24 may have aborted a previous route during route execution (e.g. because a unit operation station breaks down), so that vehicle 24 may be selected for assignment of a new route even though it is not empty. Once the vehicle 24 has been selected, the track system controller 108 can request, from the product scheduling controller 106, the route and associated finished product that is to be assigned to that vehicle 24. Each route request describes the type of vehicle and any operations that have already been completed on that vehicle on a previous route that included loading a container but did not include unloading the container.

The Demand Propagation Phase (215) will now be discussed in greater detail and with reference to FIG. 10 and the other drawing figures. In one embodiment, hereafter referred to as the Assignment-Time Calculated Demand Embodiment, the Demand Propagation Phase (215) is entered upon receiving the route request from the track system controller 108. In another embodiment, hereafter referred to as the Pre-Calculated Demand Embodiment, the Demand Propagation Phase (215) can be entered without waiting for a route request from the track system controller 108, so that a route can be assigned in response to a route request from the track system controller 108 in less time, because the Demand Propagation Phase (215) will have already been completed. This is possible because the Demand Propagation Phase (215) does not depend on having previously selected a vehicle 24 for route assignment. A disadvantage of the Pre-Calculated Demand Embodiment is that it may require more computing overall, since the Demand Propagation Phase (215) may be executed more times than needed. Although the events triggering the Assignment-Time Calculated Demand Embodiment and the Pre-Calculated Demand embodiment differ, the Demand Calculation process is the same and will next be described in greater detail.

First, the product scheduling controller 106 can identify all of the finished products that are needed next at each of the available (e.g. not broken down) unloading stations 90 to fulfill the unloading station's 90 production schedule in the order specified by the unloading station's 90 production schedule, and establishes demand items corresponding to these products (300). These demand items can be understood to describe the finished products that are currently assigned to each unloading station 90 and which can next be loaded into the package without interfering with the order of the overall package as defined by the production schedule, and where no vehicle 24 has already been assigned a route and associated finished product to thereby fulfill. The demand items may also be partially finished products that have completed one or more, but not all, of the steps in the process of creating the finished products, or empty vehicles (in the case of loading unit operation stations). Thusly, it can be understood that demand items 300 comprise descriptions of products which may be finished products or partially finished products.

Furthermore, each demand item also describes a time span. The time span described by each demand item specifies the time range during which such a product should arrive at the unit operation station, in this case the unit operation station being an unloading station 90. This time range ensures that the demand item does not describe a need for a product that would arrive earlier than a prerequisite product, nor later than a postrequisite product. Through additional processing to be described below, this time range can more generally be described as representing a time range when the arrival of the described product would not violate any system constraints.

Each demand item is furthermore associated with a particular unit operation station, such that it could be said that the unit operation station has one or more demand items, or that the unit operation station has no demand items. Each demand item is furthermore associated with a particular type of operation which would be performed at the associated unit operation station. Once the product scheduling controller 106 has completed establishing all appropriate demand items for each unloading station 90, the furthest downstream unit operation station group is selected for demand propagation, hereafter referred to as the Unit Operation Station Group Projecting Demand. The demand items associated with the Unit Operation Station Projecting Demand now undergo a refinement (310) so as to not include any time during which the previously scheduled vehicles 24 are expected to result in the Unit Operation Station Projecting Demand's infeed queue being at full capacity, wherein this refinement (310) may result in any of the following: no modification to the demand items; splitting demand items into two or more additional demand items wherein the additional demand items are identical to their original demand item in all but time span; shortening the associated time spans by adjusting one or both of the beginning or end times; or eliminating demand items altogether. Next, each of the demand items associated with each of the unit operation stations in the Unit Operation Station Group Projecting Demand is evaluated. The product scheduling controller 106 can then identify the furthest downstream unit operation station group that is upstream of the Unit Operation Station Group Projecting Demand (i.e., the unit operation stations a vehicle 24 might encounter immediately before proceeding to a unit operation station in the Unit Operation Station Group Projecting Demand), hereafter referred to as the Unit Operation Station Group Propagating Demand.

Each unit operation may also have associated therewith a representation of a non-existent unit operation (a virtual unit operation). Since not every container needs to receive a treatment at every unit operation station, the virtual unit operation is merely a mechanism in the computer program to allow the container to by-pass one or more unit operations, or to not have a treatment performed by such unit operation station. For example, if the containers provided into the system comprise pre-labeled bottles, there will be no need for the container to be labeled at a decoration station.

In the example of FIG. 1, the furthest downstream unit operation station group that is upstream of the unloading stations 90 that have demand items can be the decoration stations 88. The product scheduling controller 106 can then select one unit operation station from the Unit Operation Station Group Propagating Demand, hereafter referred to as the Unit Operation Station Propagating Demand. The product scheduling controller 106 can then determine whether the Unit Operation Station Propagating Demand is currently available (315) or if it supports one or more operations that will establish one or more attributes of the product described by the demand item currently being evaluated (320). If the Unit Operation Station Propagating Demand is currently unavailable or if it does not support one or more operations that will establish one or more attributes of the product described by the demand item currently being evaluated, the evaluation of this demand item being processed by the Unit Operation Station Propagating Demand is complete. If the Unit Operation Propagating Demand is currently available and supports one or more operations that will establish one or more attributes of the product described by the demand item, the product scheduling controller 106 can calculate the time delay (330) which can be the time it takes for the Unit Operation Station Propagating Demand to complete its operation on the container (e.g., the operation time) in addition to the travel time from the Unit Operation Station Propagating Demand to a downstream interface point on primary transport portion 76 in addition to the travel time from an upstream interface point on primary transport portion 76 to the unit operation station associated with the demand item. Thusly, the time span specified by the demand item being evaluated having been offset by the above-described time delay (330) can be taken to mean the time range during which the operation can begin at the unit operation station.

The interface points are advantageous, because they reduce the number of required configurations that must be established and maintained by the product scheduling controller. Without the interface points, the product scheduling controller must store a configuration for expected travel time to move a vehicle from every unit operation station in a unit operation station group to every unit operation station in an adjacently downstream unit operation station group. For the track configuration shown in FIG. 1, considering only such configurations for unit operation stations 86, there being four unit operation stations 88 in the adjacently downstream unit operation station group, each of the four unit operation stations 86 would require four expected travel time configurations, totaling 16 expected travel time configurations. With interface points, the product scheduling controller only stores configurations for expected travel time to the next interface point, and from interface points to unit operation stations in the adjacently downstream unit operation station group. Thus, in the example of the unit operation stations 86, only eight configurations need to be stored, comprising four expected travel times to I3 (1 from each unit operation station 86) and four expected travel times from I3 (1 to each unit operation station 88). The benefits of using interface points are even greater on larger track systems. For example, if there were 100 unit operation stations 86 and 90 unit operation stations 88, there would be 9,000 configurations required without interface points, but only 190 configurations required with interface points.

A new demand item can then be created (340), where the new demand item is associated with the Unit Operation Station Propagating Demand, has a time span specified as the time span of the demand item being evaluated minus a time delay (330). The new demand item's described product is the product described by the demand item being evaluated minus the attribute or attributes established by the operation to be completed at the Unit Operation Station Propagating Demand. The new demand item's time span will then undergo a first refinement (345) so as to not include any time during which the previously scheduled vehicles 24 are expected to result in the Unit Operation Station Propagating Demand's infeed queue being at full capacity, wherein this first refinement (345) may result in any of the following: no modification to the new demand item; splitting the new demand item into two or more additional demand items wherein the additional demand items are identical to the new demand item in all but time span; shortening the time span by adjusting one or both of the beginning or end times; or eliminating the new demand item altogether.

This first refinement (345) and the refinement (310) are useful, because they accomplish avoiding demand during times when assigning a vehicle 24 to meet that demand would result in exceeding the capacity of the Unit Operation Station Propagating Demand's infeed queue. This could cause vehicles 24 to block portions or all of track section (secondary transport portion) 78 and/or portions or all of track section (primary transport portion) 76. Furthermore, this first refinement can similarly refine the time span of the new demand item so as to avoid demand during times when assigning a vehicle 24 to meet that demand would result in that vehicle 24 causing the Unit Operation Station Propagating Demand's infeed queue to exceed its capacity, wherein such a capacity violation would be caused either directly by the arrival of that vehicle 24 or indirectly by the cascading impact of previously scheduled but subsequently arriving other vehicles 24, and where such capacity is represented by a configuration parameter associated with the Unit Operation Station Propagating Demand.

Upon completion of the first refinement (345), the set of any remaining of the new demand item or additional demand items, hereafter collectively referred to as the Set of Remaining Demand Items, can be understood to represent time spans when beginning the operation on the described product would not violate any system constraints. The Set of Remaining Demand Items is again time shifted, this time to adjust according to previously scheduled vehicles 24 so that the resulting time spans represent time spans when arrival of the described product at the Unit Operation Station Propagating Demand's infeed queue would not violate any system constraints, thusly taking into account time when a vehicle 24 would be waiting in the Unit Operation Station Propagating Demand's infeed queue prior to beginning the operation, which can be known based on previously assigned routes to other vehicles 24 combined with vehicle 24 position information shared from the track system controller 108 with the product scheduling controller 106. This time shift applied to the Set of Remaining Demand Items marks the completion of the evaluation of this demand item being processed by the Unit Operation Station Propagating Demand.

When the evaluation of this demand item being processed by the Unit Operation Station Propagating Demand is complete (e.g. the Unit Operation Station Propagating Demand has been found to either be unsuitable for this demand item or else new demand items were created and refined), the product scheduling controller 106 can then proceed to evaluate this demand item being processed by each of the other unit operation stations in the Unit Operation Station Group Propagating Demand by the same process as was used to evaluate this demand item being processed by the Unit Operation Station Propagating demand.

When the evaluation of this demand item being processed by each of the unit operation stations in the Unit Operation Station Group Propagating Demand is complete, the product scheduling controller 106 proceeds to continue evaluating each demand item associated with the Unit Operation Station Projecting Demand being processed by each of the unit operation stations in the Unit Operation Station Group Propagating Demand.

When the evaluation of each demand item associated with the Unit Operation Station Projecting Demand by each of the unit operation stations in the Unit Operation Station Group Propagating Demand has been completed, the product scheduling controller 106 evaluates each of the demand items associated with each of the other unit operation stations in the Unit Operation Station Group Projecting Demand being processed by each of the unit operation stations in the Unit Operation Station Group Propagating Demand. When this is completed, demand propagation for the demand items associated with the unit operation stations in the Unit Operation Station Group Projecting Demand is complete, and new demand items may have been created that are associated with unit operation stations in the Unit Operation Station Group Propagating Demand. Next, the Demand Propagation Phase continues with the product scheduling controller 106 selecting the Unit Operation Station Group Propagating Demand as the Unit Operation Station Group Projecting Demand, and selecting the furthest downstream unit operation station group that is upstream of the Unit Operation Station Group Propagating Demand as the Unit Operation Station Group Propagating Demand, and similarly completing demand propagation for any demand items associated with the new Unit Operation Station Group Projecting Demand. This process repeats until the furthest upstream unit operation station group would be selected as the Unit Operation Station Group Projecting Demand, at which point the Demand Propagation Phase is complete.

In another embodiment of the Demand Propagation Phase, an additional demand aggregation step may be executed in between processing demand for each unit operation station group (e.g. each time a different unit operation station group is selected as the Unit Operation Station Group Projecting Demand). The demand aggregation step will examine the demand items associated with each unit operation station in the newly selected Unit Operation Station Group Projecting Demand, and, after accounting for differences in travel time from an upstream interface point, creates a set of new demand items based on this set of existing demand items, where the set of new demand items describes time periods when products arriving at the interface point would not violate any system constraints. In establishing the set of new demand items, duplicate time spans for similar products can be eliminated, and adjacent demand items can be merged, reducing the number of demand items to process. This is advantageous to reduce the processing time required to complete the Demand Propagation Phase. When such an additional demand aggregation step is used, the set of new demand items is projected to the Unit Operation Station Group Propagating Demand instead of the demand items associated with the Unit Operation Station Group Projecting Demand, and the calculated time delay 330 does not factor in the travel time from the interface point to the Unit Operation Station Projecting Demand, since this travel time was already accounted for.

In yet another embodiment of the Demand Propagation Phase, demand items may also specify a quantity of the described product. When these quantities are propagated with their associated demand items, additional demand information is available to the subsequent phases of the product scheduling process, which can help to better optimize production efficiency, and can be used to assign more than one route without executing the Demand Propagation Phase in between route assignments as would normally be required. This can be advantageous so as to reduce the amount of computing the product scheduling controller 106 must perform.

The Effective Route Identification Phase will now be discussed in greater detail with reference to FIG. 12. Upon receiving the route request 400 from the track system controller 108, the route request 400 including a description of the type of vehicle and state of assembly, the product scheduling controller 106 can enter the Effective Route Identification Phase. Firstly, if the Demand Propagation Phase has not already been completed as in the case of the pre-calculated demand embodiment, the Demand Propagation Phase is now completed. A projected route time is established as the time when the route request 400 was received by the product scheduling controller 106. A current product type is established as the vehicle and state of assembly described by the route request. For each unit operation station in the furthest upstream unit operation station group, the iterative route identification process 405 is completed.

The iterative route identification process 405 starts with the product scheduling controller 106 establishing a potential route buffer, and copying into it the contents of the previous potential route buffer if one exists 410. The iterative route identification 405 process continues with the product scheduling controller 106 modifying the projected route time by adding the time it takes to travel from an upstream interface point to the current unit operation station. The iterative route identification process continues with the product scheduling controller 106 determining if the current unit operation station has a demand item describing the current product type where the associated time span includes the projected route time 415, where such a demand item is hereafter referred to as the Relevant Demand Item. If a Relevant Demand Item does not exist, the potential route buffer is deleted 420 and no further action is taken by this instance of the iterative route identification process 405. If a Relevant Demand Item does exist, the iterative route identification process 405 continues by adding information describing the current unit operation station and the operation specified by the Relevant Demand Item to the potential route buffer 425.

If the current unit operation station is not part of the furthest downstream unit operation station group 430, a new instance of the iterative route identification process 405 is started for each unit operation station in the unit operation station group immediately downstream of the unit operation station group to which the current unit operation station belongs, where the new instances of the iterative route identification process 405 are provided with projected route times that have been amended to add the time a vehicle would spend waiting at the current unit operation station's infeed queue during execution of this route wherein this time is based on previously scheduled vehicles 24 and information shared from the track system controller 108, the time a vehicle would spend undergoing the operation specified by the Relevant Demand Item at the current unit operation station, and the travel time from the current unit operation station to a downstream interface point. Likewise, the new instances of the iterative route identification process are provided with this instance's potential route buffer to copy into their new potential route buffers. Likewise, the product type considered by the new instances of the iterative route identification process are taken to be the product type considered by this instance of the iterative route identification process, modified to include the one or more attributes established by the operation specified by the Relevant Demand Item. If the current unit operation station belongs to the furthest downstream unit operation station group, the potential route buffer is added to a list of effective routes 435, which completes this instance of the iterative route identification process 405.

Once each instance of the iterative route identification process 405 has completed, the list of effective routes comprises a list of all potential routes the vehicle 24 specified in the route request 400 may be assigned, which is to say the list of all potential routes that will deliver a product to a package specified by the production order without violating any system constraints. Once each instance of the iterative route identification process 405 has completed 440, the Effective Route Identification Phase is complete and the Route Ranking Phase begins 445. In one embodiment, the Effective Route Identification Phase would only continue as long as the number of routes in the list of effective routes is less than a specified number. This would have the effect of identifying no more than a specified number of routes, which can be beneficial to reduce the worst-case processing time for the Effective Route Identification Phase, although this embodiment does pose a risk of not identifying the best route as an effective route. The specified number of routes may be a fixed number, or a number calculated based on parameters related to processor utilization of the product scheduling controller 106.

The Route Ranking Phase will now be discussed in greater detail with reference to FIGS. 13A and 13B. The Route Ranking Phase comprises first undergoing the Route Metric Generation Sub-Phase and subsequently the Route Sorting Sub-Phase.

The Route Metric Generation Sub-Phase will now be discussed in greater detail. First, the product scheduling controller 106 can calculate a weighting factor (510) for each unit operation station group based on the utilization of each unit operation station within the unit operation station group, where unit operation station groups that have less unused capacity will yield larger weighting factor values. This weighting factor enables better production optimization because it allows calculations subsequently described to prioritize optimizing capacity utilization of the busiest unit operation stations. For each route in the list of effective routes, the product scheduling controller 106 will perform the following calculations to identify a Queue Length (QL) metric, an Unused Unit Count (UC) metric, a Nearly Starved Unit Count (NSC) metric, a Vehicles Already Scheduled Count (VASC) metric, and a Non-Productive Time (NPT) metric. The QL metric is related to the sum of infeed queue lengths at each unit operation station along the current effective route at the time this vehicle 24 would arrive if this route is selected. The UC metric is related to the number of unit operation stations along the current effective route that will have been idle and starved for a specified period of time before this vehicle's 24 arrival if this route is selected. The NSC metric is related to the number of unit operation stations along the current effective route that will become idle if not for the selection and execution of this route by this vehicle 24. The VASC metric is related to the number of previously scheduled vehicles 24 scheduled to in the future arrive at the unit operation stations along the current effective route. The NPT metric is related to the time this vehicle 24 would spend travelling or waiting at unit operation station infeed queues along the current effective route. The product scheduling controller 106 can initially set to zero each of a QL metric, a UC metric, an NSC metric, a VASC metric, and an NPT metric.

For each unit operating station along the current effective route, the following calculations are performed to update the route's QL metric, UC metric, NSC metric, VASC metric, and NPT metric. The product scheduling controller 106 can calculate a QL value (515) by multiplying the weighting factor with the infeed queue length at the time the vehicle 24 is expected to arrive at the unit operation station. The QL value can be added to the QL metric (520). The product scheduling controller 106 can then calculate a UC value (525). If this unit operation station has no other vehicles 24 scheduled for operations during a specified period of time immediately preceding the expected arrival of this vehicle 24 at this unit operation station, the UC value is the weighting factor. Otherwise, the UC value is zero. The UC value can be added to the UC metric (530). The product scheduling controller 106 can then calculate a NSC value (535). If this unit operation station will become idle if not for the arrival of this vehicle and its ensuing associated operation, the NSC value is the weighting factor. Otherwise, the NSC value is zero. The NSC value can be added to the NSC metric (540). The product scheduling controller 106 can then calculate a VASC value (545) by multiplying the weighting factor with the number of previously scheduled vehicles 24 scheduled to in the future arrive at the unit operation station. The VASC value can be added to the VASC metric (550). The product scheduling controller 106 can then calculate an NPT value (555) by multiplying the weighting factor with the sum of: 1) the travel time from an upstream interface point on the primary transport portion 76 to this unit operation station, 2) the time the current vehicle is expected wait in the infeed queue of this unit operation station, and 3) the travel time from this unit operation station to a downstream interface point on the primary transport portion 76. The NPT value can be added to the NPT metric (560). When the QL metric, UC metric, NSC metric, VASC metric, and NPT metric have all been calculated for all routes in the list of effective routes, the Route Metric Generation Sub-Phase is complete and the product scheduling controller 106 begins the Route Sorting Sub-Phase.

Referring to FIG. 13B, the Route Sorting Sub-Phase will now be described in greater detail. The Route Sorting Sub-Phase will compare the metrics generated during the Route Metric Generation Sub-Phase to identify the best route for the current vehicle 24 from the list of effective routes identified in the Effective Route Identification Phase. Each route in the list of effective routes is compared to the other routes in the list of effective routes on the basis of the metrics generated during the Route Metric Generation Sub-Phase. A route with a smaller QL metric is a better route 585. If the QL metrics are identical, a route with a higher UC metric is a better route 595. If the QL and UC metrics are identical, a route with a higher NSC metric is a better route 600. If the QL, UC, and NSC metrics are identical, a route with a higher VASC metric is a better route 605. If the QL, UC, NSC, and VASC metrics are identical, a route with a lower NPT metric is a better route 610. If the QL, UC, NSC, VASC, and NPT metrics are identical, neither route is better than the other 615, so a route is arbitrarily selected.

Once the product scheduling controller 106 has identified the best route from the list of effective routes, the specifics of the route are communicated to the track system controller 108 so as to enable the track system controller 108 to cause the vehicle 24 to move as specified by the route and operate unit operation stations as specified by the route.

Numerous alternative embodiments of the Route Sorting Sub-Phase are possible. One alternative embodiment of the Route Sorting Sub-Phase could compute an overall route score for each route as the sum of the products of some or all of the QL, UC, NSC, VASC, and NPT metrics and a weighting factor for each metric. This embodiment would take each metric into account to degrees alterable by modifying the weighting factor associated with each metric.

So as to determine the best route for each vehicle, the route determination may consider configurations for expected time required to travel along the track or expected time required to complete operations. When the track system controller observes completion of a vehicle's movement along a portion of the track, it may automatically cause an update to a configuration for expected time required to travel along that portion of the track, or a configuration associated with the degree of variability in said time, for example a standard deviation of a set of said times observed in the past. Likewise, when the track system controller observes completion of an operation, it may automatically cause an update to a configuration for the expected time required for that operation as that unit operation station, or a configuration associated with the degree of variability in said time, for example a standard deviation of a set of said times observed in the past. In this manner, the determination of a route can be self-optimizing, such that the route determination step becomes more effective with each use without requiring manual effort, and adapts to changes in track performance or unit operation station performance without manual effort.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

The dimensions and/or values disclosed herein are not to be understood as being strictly limited to the exact numerical dimensions and/or values recited. Instead, unless otherwise specified, each such dimension and/or value is intended to mean the recited dimension and/or value and a functionally equivalent range surrounding that dimension and/or value. For example, a dimension disclosed as "40 mm" is intended to mean "about 40 mm".

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Every document cited herein, including any cross referenced or related patent or application is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A system for simultaneously dispensing different fluent materials into different containers, said system comprising:
   at least one first container and at least one second container for holding fluent material;
   a track system;
   at least one unit operation station for dispensing fluent material disposed along the track system;
   a plurality of vehicles propellable along the track system, wherein:
      a first container and a second container are disposed on the same or different vehicles;
      each vehicle is independently routable along the track system to deliver the first container and the second container to the at least one unit operation station;
   a control system comprising one or more controller units, wherein the one or more controller units receive demand for finished products to be made and determine a route for a vehicle, wherein the route is determined based on a status of one or more unit operation stations; and
   wherein the first container and the second container receive one or more fluent materials dispensed by one or more filling unit operation stations for dispensing fluent material, wherein the filling unit operation stations are configured to dispense fluent material so that a first fluent composition and a second fluent composition in the first container and the second container differ from one another in one or more of the following ways:
      there is a difference in the presence or type of at least one ingredient in the fluent composition in the first container and the fluent composition in the second container, and/or
      the fluent compositions in the first container and the second container have at least one common ingredient, and at least one of the following relationships is present:
         (a) the difference in weight percentage of the same ingredient in the two fluent compositions is greater than or equal to about 1.1 as determined by dividing the weight percent of the ingredient that is present in the greater amount in the two fluent compositions by the weight percent of the same ingredient that is present in the lesser amount in the two fluent compositions; and
         (b) when the weight percentage of at least one of the ingredients common to both the first and second containers is present in the two fluent compositions in an amount of at least 2%, and the difference of the weight percent of the same ingredient in the two fluent compositions is greater than or equal to 2%,
      wherein the first containers have a volume and a shape, and the second container has one or more of a volume, appearance, and a shape that is different from one or more of a volume, appearance, and a shape, respectively, of the first container.

2. The system of claim 1 wherein the track system is a linear synchronous motor system wherein the vehicles comprise a magnet, and the vehicles are propellable along the track system using electromagnetic force.

3. The system of claim 1, wherein the track system comprises:
   a primary transport portion that defines a primary path that forms a closed loop; and
   a secondary transport portion that extends from the primary transport portion and defines a secondary path that intersects the primary path at an ingress location and an egress location, wherein a unit operation station is disposed along said secondary transport portion.

4. The system of claim 3, wherein a unit operation station is disposed along said primary transport portion, wherein the unit operation station disposed along said primary transport portion comprises a fast cycle unit operation station.

5. The system of claim 1 wherein a single unit operation station is configured to dispense different fluent materials into the first and second containers.

6. The system of claim 1 comprising two or more unit operation stations, and one of said two or more unit operation stations is configured to dispense a different fluent material from that dispensed by another unit operation station.

7. The system of claim 1 wherein said first and second containers are disposed on the same vehicle.

8. The system of claim 1 wherein said first and second containers are disposed on different vehicles.

9. The system of claim 1 wherein said at least one unit operation station for dispensing fluent material comprises a plurality of unit operation stations for dispensing fluent material, and at least two different vehicles are simultaneously routable to different unit operation stations for independent dispensing of first fluent material into a first container at one unit operation station and a second fluent material into a second container at another unit operation station, wherein said first and second fluent materials are different.

10. A method for simultaneously dispensing different fluent materials into different containers, said method comprising the steps of:
   (a) providing a track system comprising a track on which container-loaded vehicles are propellable, wherein a plurality of unit operations stations are disposed along the track system, wherein said unit operation stations comprise at least one filling unit operation station:

(b) providing a plurality of empty containers, said containers comprising:
  a plurality of first containers, each having a shape, an opening and a volume for holding a fluent material; and
  a plurality of second containers, each having a shape, an appearance, an opening and a volume for holding a fluent material, wherein one or more of the shape, appearance, and the volume of each of the second containers is different from one or more of the shape, appearance, and the volume, respectively, of each of the first containers;
(c) providing a plurality of vehicles propellable along said track system;
(d) a first container and a second container are loaded onto the same or different vehicles;
(e) providing a control system comprising one or more controller units, wherein the one or more controller units receive demand for finished products to be made and determine a route for a vehicle, wherein the route is determined based on a status of one or more unit operation stations;
(f) sending said first container-loaded vehicle to a filling unit operation station configured to dispense a first fluent material into a container;
(g) sending said second container-loaded vehicle to a filling unit operation station configured to dispense a second fluent material into a container, wherein said first and second fluent materials differ; and
(h) simultaneously dispensing said first fluent material into said first container and said second fluent material into said second container.

11. The method of claim 10 wherein the first empty container and the second empty container are loaded on the same vehicle, and are sent to the same filling unit operation station for dispensing fluent material into the containers, which filling unit operation station is configured for dispensing a first fluent material and a second fluent material into two or more containers at the same time.

12. The method of claim 10 wherein the first empty container and the second empty container are loaded on different vehicles, and are sent to the same filling unit operation station for dispensing fluent material into the containers, which filling unit operation station is configured for dispensing a first fluent material and a second fluent material into two or more containers at the same time.

13. The method of claim 10 wherein the first empty container and the second empty container are loaded on different vehicles, and are sent to different filling unit operation stations for dispensing the different fluent materials into the containers.

14. The method of claim 10 wherein said first and second containers are of different sizes.

15. The method of claim 10 wherein said first and second containers are of different shapes.

16. The method of claim 10 wherein the fluent compositions in said first and second containers differ from one another in one or more of the following ways:
  there is a difference in the presence or type of at least one ingredient in the fluent composition in the first container and the fluent composition in the second container, and/or
  the fluent compositions in the first and second containers have at least one common ingredient, and at least one of the following relationships is present:
    (a) the difference in weight percentage of the same ingredient in the two fluent compositions is greater than or equal to about 1.1 as determined by dividing the weight percent of the ingredient that is present in the greater amount in the two fluent compositions by the weight percent of the same ingredient that is present in the lesser amount in the two fluent compositions; and
    (b) when the weight percentage of at least one of the ingredients common to both the first and second containers is present in the two fluent compositions in an amount of at least 2%, and the difference of the weight percent of the same ingredient in the two fluent compositions is greater than or equal to 2%.

* * * * *